United States Patent
Bailey, III et al.

(10) Patent No.: US 10,032,681 B2
(45) Date of Patent: Jul. 24, 2018

(54) ETCH METRIC SENSITIVITY FOR ENDPOINT DETECTION

(71) Applicant: Lam Research Corporation, Fremont, CA (US)

(72) Inventors: Andrew D. Bailey, III, Pleasanton, CA (US); Mehmet Derya Tetiker, San Francisco, CA (US); Duncan W. Mills, Mountain View, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/059,073

(22) Filed: Mar. 2, 2016

(65) Prior Publication Data
US 2017/0256463 A1 Sep. 7, 2017

(51) Int. Cl.
*H01L 21/66* (2006.01)
*G06F 17/50* (2006.01)
(Continued)

(52) U.S. Cl.
CPC .............. *H01L 22/12* (2013.01); *G01B 11/24* (2013.01); *G06F 17/10* (2013.01);
(Continued)

(58) Field of Classification Search
None
See application file for complete search history.

(56) References Cited

U.S. PATENT DOCUMENTS

| 5,114,233 A | 5/1992 | Clark et al. |
|---|---|---|
| 5,421,934 A | 6/1995 | Misaka et al. |

(Continued)

OTHER PUBLICATIONS

Cooperberg, D.J., et al. "Semiempirical profile simulation of aluminum etching in a $Cl_2$ / $BCl_3$ plasma," Journal of Vacuum Science & Technology A., vol. 20, No. 5, Sep./Oct. 2002, pp. 1536-1556. [doi: http://dx.doi.org/10.1116/1.1494818].

(Continued)

*Primary Examiner* — Angel Roman
(74) *Attorney, Agent, or Firm* — Weaver Austin Villeneuve & Sampson LLP

(57) ABSTRACT

Monitoring a geometric parameter value for one or more features produced on a substrate during an etch process may involve: (a) measuring optical signals produced by optical energy interacting with features being etched on the substrate; (b) providing a subset of the measured optical signals, wherein the subset is defined by a range where optical signals were determined to correlate with target geometric parameter values for features; (c) applying the subset of optical signals to a model configured to predict the target geometric parameter values from the measured optical signals; (d) determining, from the model, a current value of the target geometric parameter of the features being etched; (e) comparing the current value of the target geometric parameter of the features being etched to an etch process endpoint value for the target geometric parameter; and (f) repeating (a)-(e) until the comparing in (e) indicates that the current value of the target geometric parameter of the features being etched has reached the endpoint value.

39 Claims, 8 Drawing Sheets

(51) Int. Cl.
  *G06F 17/10* (2006.01)
  *H01L 21/3065* (2006.01)
  *G01B 11/24* (2006.01)

(52) U.S. Cl.
  CPC ...... *G06F 17/5009* (2013.01); *H01L 21/3065* (2013.01); *H01L 22/26* (2013.01); *G01B 2210/56* (2013.01)

(56) References Cited

U.S. PATENT DOCUMENTS

| | | | |
|---|---|---|---|
| 6,268,226 B1 | 7/2001 | Angell et al. | |
| 6,410,351 B1 | 6/2002 | Bode et al. | |
| 6,650,423 B1 | 11/2003 | Markle et al. | |
| 6,684,382 B2 | 1/2004 | Liu | |
| 6,804,572 B1 | 10/2004 | Cooperberg et al. | |
| 6,903,826 B2 | 6/2005 | Usui et al. | |
| 7,139,632 B2 | 11/2006 | Cooperberg et al. | |
| 7,402,257 B1 | 7/2008 | Sonderman et al. | |
| 7,588,946 B2 | 9/2009 | Tso et al. | |
| 7,600,212 B2 | 10/2009 | Zach et al. | |
| 7,739,651 B2 | 6/2010 | Melvin, III et al. | |
| 7,812,966 B2 | 10/2010 | Hoffmann et al. | |
| 7,849,423 B1 | 12/2010 | Yenikaya et al. | |
| 7,962,867 B2 | 6/2011 | White et al. | |
| 8,001,512 B1 | 8/2011 | White | |
| 8,279,409 B1 | 10/2012 | Sezginer et al. | |
| 9,471,746 B2 | 10/2016 | Rieger et al. | |
| 9,547,740 B2 | 1/2017 | Moroz et al. | |
| 9,792,393 B2 | 10/2017 | Tetiker et al. | |
| 2003/0008507 A1 | 1/2003 | Bell et al. | |
| 2003/0113766 A1 | 6/2003 | Pepper et al. | |
| 2005/0074907 A1* | 4/2005 | Kriz ........................ | H01L 22/26 438/9 |
| 2006/0141484 A1 | 6/2006 | Rucker et al. | |
| 2007/0249071 A1* | 10/2007 | Lian .................. | G01B 11/0625 438/16 |
| 2007/0281478 A1 | 12/2007 | Ikegami et al. | |
| 2008/0035608 A1 | 2/2008 | Thomas et al. | |
| 2009/0048813 A1 | 2/2009 | Ichikawa et al. | |
| 2009/0087143 A1 | 4/2009 | Jeon et al. | |
| 2009/0253222 A1 | 10/2009 | Morisawa et al. | |
| 2011/0022215 A1 | 1/2011 | Keil et al. | |
| 2011/0292375 A1* | 12/2011 | Marx ...................... | G01B 11/22 356/51 |
| 2012/0002912 A1* | 1/2012 | Studenkov ............. | G02B 6/105 385/11 |
| 2015/0154145 A1 | 6/2015 | Watanabe et al. | |
| 2017/0147724 A1 | 5/2017 | Regli et al. | |
| 2017/0176983 A1 | 6/2017 | Tetiker et al. | |
| 2017/0228482 A1 | 8/2017 | Tetiker et al. | |
| 2017/0363950 A1 | 12/2017 | Sriraman et al. | |
| 2017/0371991 A1 | 12/2017 | Tetiker et al. | |

OTHER PUBLICATIONS

Goodlin et al. (May 2002) "Quantitative Analysis and Comparison of Endpoint Detection Based on Multiple Wavelength Analysis," 201st Meeting of the Electrochemical Society, International Symposium on Plasma Processing XIV, Abs. 415, Philadelphia, PA, 30 pages.

Hoekstra, R. et al. "Comparison of two-dimensional and three-dimensional models for profile simulation of poly-Si etching of finite length trenches," Journal of Vacuum Science & Technology A, vol. 16, No. 6, Nov. 1, 1998, pp. 3274-3280. [doi:http://dx.doi.org/10.1116/1.581533].

Hoekstra, R. et al. "Integrated plasma equipment model for polysilicon etch profiles in an inductively coupled plasma reactor with subwafer and superwafer topography," Journal of Vacuum Science & Technology A, vol. 15, No. 4, Jul./Aug. 1997, pp. 1913-1921. [doi: http://dx.doi.org/10.1116/1.580659].

Hoekstra, R. et al. "Microtrenching resulting from specular reflection during chlorine etching of silicon," Journal of Vacuum Science & Technology B, Nanotechnology and Microelectronics, vol. 16, No. 4, Jul./Aug. 1998, pp. 2102-2104. [doi: http://dx.doi.org/10.1116/1.590135].

Huard, C.M., et al. "Role of neutral transport in aspect ratio dependent plasma etching of three-dimensional features," Journal of Vacuum Science & Technology A., vol. 35, No. 5, Jan. 17, 2017, pp. 05C301-1-05C301-18. [doi: http://dx.doi.org/10.1116/1.4973953].

Kushner, M.J., "Hybrid modelling of low temperature plasmas for fundamental investigations and equiptment design," Journal of Physics D., vol. 42, Sep. 18, 2009, pp. 1-20. [doi: 10.1088/0022-3727/42/19/194013].

Lynn et al. (2009) "Virtual Metrology for Plasma Etch using Tool Variables," IEEE, pp. 143-148.

Lynn, Shane (Apr. 2011) "Virtual Metrology for Plasma Etch Processes," A thesis submitted in partial fulfillment for the degree of Doctor of Philosophy in the Faculty of Science and Engineering, Electronic Engineering Department, National University of Ireland, Maynooth,361 pages.

Moharam et al. (Jul. 1981) "Rigorous coupled-wave analysis of planar-grating diffraction," J. Opt. Soc. Am., 71(7):811-818.

Radjenović et al.(2007) "3D Etching profile evolution simulations: Time dependence analysis of the profile charging during SiO2 etching in plasma," 5th EU-Japan Joint Symposium on Plasma Process, Journal of Physics: Conference Series 86:13 pages.

Ringwood et al. (Feb. 2010) "Estimation and Control in Semiconductor Etch: Practice and Possibilities," IEEE Transactions on Semiconductor Manufacturing, 23(1):87-98.

Sankaran, A. et al. (Jan. 15, 2005) "Etching of porous and solid $SiO_2$ in $Ar/c-C_4F_8$, $O_2/c-C_4F_8$ and $Ar/O_2/c-C_4F_8$ plasmas," Journal of Applied Physics, 97(2):023307-1-023307-10. [doi: http://dx.doi.org/10.1063/1.1834979] [retrieved on Jan. 29, 2005].

Sankaran, A. et al. (Jul./Aug. 2004) "Integrated feature scale modeling of plasma processing of porous and solid $SiO_2$. I. Fluorocarbon etching," Journal of Vacuum Science & Technology A., 22(4):1242-1259. [doi: http://dx.doi.org/10.1116/1.1764821].

Yue et al. (Jan./Feb. 2001) "Plasma etching endpoint detection using multiple wavelengths for small open-area wafers," J. Vac. Sci. Technol. A, 19(1):66-75.

Zeng (2012) "Statistical Methods for Enhanced Metrology in Semiconductor/Photovoltaic Manufacturing," A dissertation submitted in partial satisfaction of the requirements for the degree of Doctor of Philosophy in Engineering—Electrical Engineering and Computer Sciences in the Graduate Division of the University of California, Berkeley, 171 pages.

Zhang, D. et al. (Mar./Apr. 2001) "Investigations of surface reactions during $C_2F6$ plasma etching of $SiO_2$ with equipment and feature scale models," Journal of Vacuum Science & Technology A, 19(2):524-538. [doi: http://dx.doi.org/10.1116/1.1349728].

Zhang, Y., (Sep. 30, 2015) Doctoral Dissertation of "Low Temperature Plasma Etching Control through Ion Energy Angular Distribution and 3-Dimensional Profile Simulation," Dept. of Electrical Engineering at the University of Michigan, pp. 49-71, Appendix B. pp. 243-248. [doi: http://hdl.handle.net/2027.42/113432].

U.S. Appl. No. 14/972,969, filed Dec. 17, 2015, Tetiker et al.
U.S. Appl. No. 15/018,708, filed Feb. 8, 2016, Tetiker et al.
U.S. Appl. No. 15/188,910, filed Jun. 21, 2016, Sriraman et al.
U.S. Appl. No. 15/367,060, filed Dec. 1, 2016, Mailfert et al.
U.S. Appl. No. 15/583,610, filed May 1, 2017, Tetiker et al.
U.S. Office Action, dated Mar. 22, 2017, issued in U.S. Appl. No. 15/018,708.
U.S. Notice of Allowance dated Jun. 7, 2017 issued in U.S. Appl. No. 15/018,708.
U.S. Notice of Allowance [Corrected Notice of Allowability], dated Sep. 8, 2017, issued in U.S. Appl. No. 15/018,708.
U.S. Appl. No. 15/673,321, filed Aug. 9, 2017, Tetiker et al.
U.S. Appl. No. 15/698,458, filed Sep. 7, 2017, Tetiker et al.
U.S. Office Action, dated Oct. 2, 2017, issued in U.S. Appl. No. 15/698,458.
U.S. Office Action, dated Dec. 7, 2017, issued in U.S. Appl. No. 15/188,910.
U.S. Office Action, dated Jan. 25, 2018, issued in U.S. Appl. No. 14/972,969.

(56) References Cited

OTHER PUBLICATIONS

U.S. Notice of Allowance, dated Feb. 6, 2018 issued in U.S. Appl. No. 15/698,458.

* cited by examiner

ETCH METRIC SENSITIVITY FOR ENDPOINT DETECTION

BACKGROUND

High performance plasma-assisted etch processes are important to the success of many semiconductor processing workflows. However, monitoring, controlling, and/or optimizing the etch processes can be difficult and time-consuming, oftentimes involving process engineers laboriously testing etch process parameters to empirically determine settings that produce a target etch profile. Additionally, in situ monitoring of etch processes can be difficult and unreliable; etch endpoint detection remains a challenge.

Computational models might be useful to facilitate designing and monitoring etch processes. Some models attempt to simulate the physical-chemical processes occurring on semiconductor substrate surfaces during etch processes. Examples include the etch profile models of M. Kushner and co-workers as well as the etch profile models of Cooperberg and co-workers. The former are described in Y. Zhang, "Low Temperature Plasma Etching Control through Ion Energy Angular Distribution and 3-Dimensional Profile Simulation," Chapter 3, dissertation, University of Michigan (2015), and the latter in Cooperberg, Vahedi, and Gottscho, "Semiempirical profile simulation of aluminum etching in a $Cl_2/BCl_3$ plasma," J. Vac. Sci. Technol. A 20(5), 1536 (2002), each of which is hereby incorporated by reference in its entirety for all purposes. Additional description of the etch profile models of M. Kushner and co-workers may be found in J. Vac. Sci. Technol. A 15(4), 1913 (1997), J. Vac. Sci. Technol. B 16(4), 2102 (1998), J. Vac. Sci. Technol. A 16(6), 3274 (1998), J. Vac. Sci. Technol. A 19(2), 524 (2001), J. Vac. Sci. Technol. A 22(4), 1242 (2004), J. Appl. Phys. 97, 023307 (2005), each of which is also hereby incorporated by reference in its entirety for all purposes. Despite the extensive work done to develop these models, they do not yet possess the desired degree of accuracy and reliability to find substantial use within the semiconductor processing industry.

SUMMARY

One aspect of this disclosure pertains to methods of monitoring or determining a geometric parameter value for one or more features produced on a substrate during an etch process. Such methods may be characterized by the following operations: (a) measuring optical signals produced by optical energy interacting with features being etched on the substrate; (b) providing a subset of the measured optical signals, wherein the subset is defined by a range where optical signals were determined to correlate with target geometric parameter values for features; (c) applying the subset of optical signals to a model configured to predict the target geometric parameter values from the measured optical signals; (d) determining, from the model, a current value of the target geometric parameter of the features being etched; (e) comparing the current value of the target geometric parameter of the features being etched to an etch process endpoint value for the target geometric parameter; and (f) repeating (a)-(e) until the comparing in (e) indicates that the current value of the target geometric parameter of the features being etched has reached the endpoint value. In certain embodiments, the model was generated by determining the range where optical signals were determined to correlate with target geometric parameter values for features. In certain embodiments, the target geometric parameter of the features being etched is an etch depth, a pitch, or an etch critical dimension.

In some implementations, the method includes the additional operation of terminating the etch process when the comparing in (e) indicates that the current value of the target geometric parameter of the features being etched has reached the endpoint value. In certain embodiments, the operation of measuring optical signals produced in (a) includes measuring reflectance produced from the features being etched on the substrate.

In certain embodiments, the range defining the subset of measured optical signals in (b) is a range of wavelengths where the optical signals were determined to correlate with the target geometric parameter value for the features. In certain embodiments, the range defining the subset of measured optical signals in (b) varies between two repetitions of (a)-(e). In some cases, the range defining the subset of measured optical signals in (b) was determined to vary according to variations in correlation of the optical signals with the target geometric parameter for different values of the target geometric parameter. In some implementations, the range defining the subset of measured optical signals in (b) is a range where the optical signals were determined to correlate less strongly with a non-target geometric parameter than the target geometric parameter.

Certain aspects of the present disclosure pertain to systems for etching one or more features on a substrate during an etch process. Such systems may be characterized by the following features: an etching apparatus for etching semiconductor substrates; and a controller for controlling the operation of the etching apparatus. The controller includes non-transitory memory storing executable instructions for (a) measuring optical signals produced by optical energy interacting with features being etched on the substrate; (b) providing a subset of the measured optical signals, wherein the subset is defined by a range where optical signals were determined to correlate with target geometric parameter values for features; (c) applying the subset of optical signals to a model configured to predict the target geometric parameter values from the measured optical signals; (d) determining, from the model, a current value of the target geometric parameter of the features being etched; (e) comparing the current value of the target geometric parameter of the features being etched to an etch process endpoint value for the target geometric parameter; and (f) repeating (a)-(e) until the comparing in (e) indicates that the current value of the target geometric parameter of the features being etched has reached the endpoint value. In certain embodiments, the model was generated by determining the range where optical signals were determined to correlate with target geometric parameter values for features. In some implementations, the target geometric parameter of the features being etched is an etch depth, a pitch, or an etch critical dimension In some implementations, the etching apparatus includes: (i) a processing chamber; (ii) a substrate holder for holding a substrate within the processing chamber; (iii) a plasma generator for generating a plasma within the processing chamber, the plasma generator comprising an RF power supply; (iv) one or more valve-controlled process gas inlets for flowing one or more process gases into the processing chamber; and (v) one or more gas outlets fluidically connected to one or more vacuum pumps for evacuating gases from the processing chamber.

In certain embodiments, the controller further includes instructions for terminating the etch process when the comparing in (e) indicates that the current value of the target geometric parameter of the features being etched has reached the endpoint value. In some embodiments, the controller's instructions for measuring optical signals produced in (a) include instructions for measuring reflectance produced from the features being etched on the substrate.

In some implementations, the controller includes instructions for varying the range defining the subset of measured optical signals in (b) between two repetitions of executing instructions for (a)-(e). In such implementations, the range defining the subset of measured optical signals in (b) may have been determined to vary according to variations in correlation of the optical signals with the target geometric parameter for different values of the target geometric parameter.

In certain embodiments, the range defining the subset of measured optical signals in (b) is a range where the optical signals were determined to correlate less strongly with a non-target geometric parameter than the target geometric parameter. In some implementations, the range defining the subset of measured optical signals in (b) is a range of wavelengths where the optical signals were determined, using a regression technique, to correlate with the target geometric parameter value for the features. Another aspect of the disclosure pertains to methods of generating a computational model that relates measured optical signals produced by optical energy interacting with features etched on a substrate to values of a target geometric parameter of the features etched on the substrate. Such methods may be characterized by the following features: (a) determining a range where the measured optical signals correlate less strongly with a non-target geometric parameter than with the target geometric parameter; (b) providing a training set having members with values of the optical signals in the range, wherein each member of the training set comprises (i) a value of the target geometric parameter of the features etched in the substrate, and (ii) an associated optical signal produced from etched features having the value of the target geometric parameter of the features etched in the substrate; and (c) producing the computational model from the training set.

In some embodiments, the target geometric parameter of the features etched on the substrate is an etch depth, a pitch, or an etch critical dimension. In some embodiments, the optical signals comprise reflectance produced from the features etched on the substrate. In some implementations, the range where the measured optical signals correlate less strongly with a non-target geometric parameter than with the target geometric parameter is a range of wavelengths. In certain embodiments, determining the range involves determining variations in the range according to variations in correlation of the optical signals with the target geometric parameter for different values of the target geometric parameter. In certain embodiments, producing the computational model from the training set involves using a neural network or a regression technique.

In some examples, the training set includes at least about 50 members. In certain embodiments, the members of the training set additionally include a value of a non-target geometric parameter of the features etched in the substrate. In some implementations, the members of the training set are obtained experimentally. In some implementations, the members of the training set are generated computationally. In such cases, the members of the training set may be generated from a surface kinetic model and an optical modelling routine.

Another aspect of the present disclosure pertains to computational models configured to calculate target geometric parameter values for features etched on a substrate from measured optical signals produced by optical energy interacting with the features etched on the substrate. Such models may be generated by a method as presented above.

For example, the members of the training set used to generate the computational model may include values of a non-target geometric parameter of the features etched in the substrate. Further, the members of the training set used to generate the computational model may be obtained experimentally or generated computationally such as from a surface kinetic model and an optical modelling routine. In some implementations, the training set included at least about 50 members. Further, the computational model may be produced from the training set using a neural network or a regression technique.

In some implementations, the computational model predicts a target geometric parameter of the features etched on the substrate, which features may be, for example, etch depth, pitch, or etch critical dimension. In some models, the optical signals include reflectance values produced from the features etched on the substrate.

In certain embodiments, when generating the computational model, the range where the measured optical signals correlate less strongly with a non-target geometric parameter than with the target geometric parameter is a range of wavelengths. In certain embodiments, when generating the computational model, determining the range comprises determining variations in the range according to variations in correlation of the optical signals with the target geometric parameter for different values of the target geometric parameter.

These and other features of the disclosed embodiments will be set forth in more detail below, with reference to the associated drawings.

DETAILED DESCRIPTION

Introduction and Context

Figure 1:
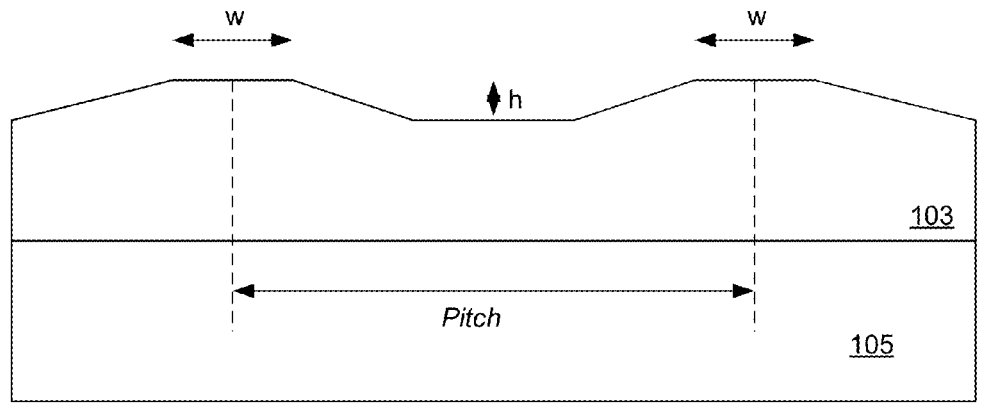
FIG. 1 illustrates the evolution of a feature during an etch process.
Figure 1:
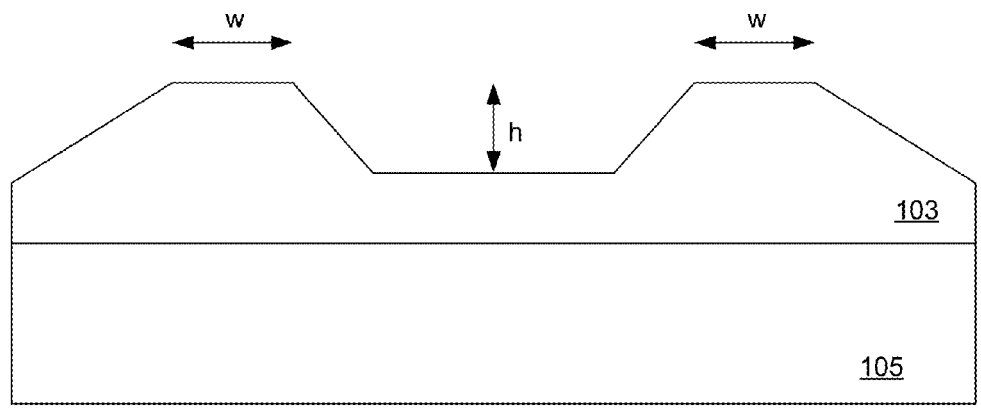
Figure 1:
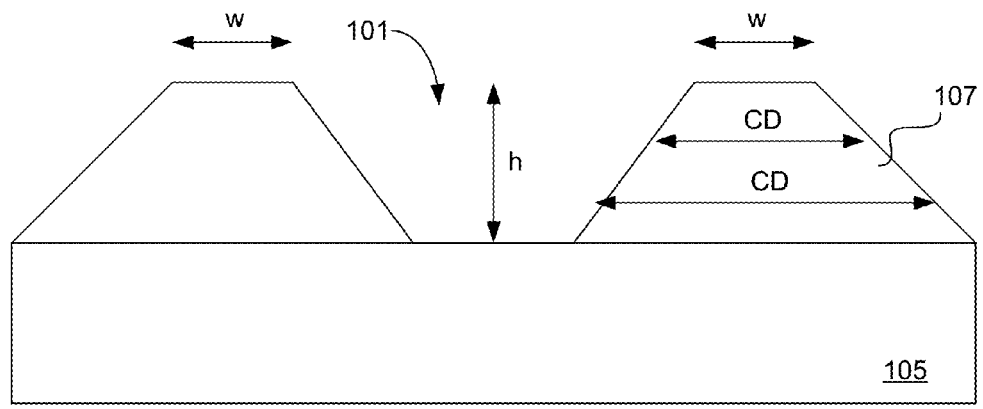

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements including pixelated displays, micro-mechanical devices and the like.

Fabrication of certain semiconductor devices involves etching features into a material or materials. The material may be a single layer of material or a stack of materials. In some cases a stack includes alternating layers of material (e.g., silicon nitride and silicon oxide). One example etched feature is a cylinder.

In various embodiments herein, features are etched in a substrate (typically a semiconductor wafer) having dielectric, semiconductor, and/or conductor material on the surface. The etching processes are generally plasma-based etching processes. A feature is a recess in the surface of a substrate. Features can have many different shapes including, but not limited to, cylinders, rectangles, squares, other polygonal recesses, trenches, etc. Examples of etched features include various gaps, holes or vias, trenches, and the like.

The following disclosure includes (1) methods and apparatus for generating computationally efficient models for determining the etch depth or other geometric parameter characterizing features produced in an etch process from a limited range of wavelengths or other time-dependent optical signal generated by in situ optical metrology equipment, and (2) models that receive a selected range of time-dependent optical signals detected by in situ metrology and use those selected optical signals to calculate the depth and/or other geometric parameter of features in a substrate undergoing etch. In certain embodiments, the features are periodic or repeating structures, such as those commonly produced for memory. While the methods and apparatus of (1) may be used to generate the models in (2), the models are not limited to those produced by such methods and apparatus. In certain embodiments, the models of (2) are generated using the processes of (1). In certain embodiments, the model is coded or otherwise implemented in an apparatus such that when it executes it provides real-time monitoring of the etch process in an etch apparatus. In some implementations, the model determines or assists in determining the endpoint of the etch process.

The models may be prepared from data generated empirically and/or computationally. In some embodiments, the data is computationally generated from (1) a surface kinetic model or similar model that predicts etch feature geometry parameters (e.g., etch profiles) from reactor etch conductions (chemical and/or physical), and (2) an optical modeling routine that predicts optical signals (e.g., wavelength-dependent reflectance) from repeating feature geometries. In such embodiments, selected etch conditions are input to the first model, which produces predicted feature geometries, which are in turn provided to the optical modeling routine, which predicts optical signals that would be produced by the feature geometries, and hence the input etch conditions. In this way, data linking optical signal values to feature geometries is generated. An etch process modeled and/or monitored as described herein may be characterized by various features. For example, the process may be characterized by the type of material or substrate being etched. The etched material may be a conductor, a dielectric, a semiconductor, or any combination thereof. Further, the etched material may be monolithic or layered. It may be used to form, memory and/or logic devices. Examples of dielectric materials for etching include silicon oxides, silicon nitrides, silicon carbides, oxynitrides, oxycarbides, carbo-nitrides, doped versions of these materials (e.g., doped with boron, phosphorus, etc.), and laminates from any combinations of these materials. Particular example materials include stoichiometric and non-stoichiometric formulations of $SiO2$, $SiN$, $SiON$, $SiOC$, $SiCN$, etc. Examples of conductor materials include, but are not limited to, nitrides such as titanium nitride and tantalum nitride and metals such as cobalt, aluminum, ruthenium, hafnium, titanium, tungsten, platinum, iridium, palladium, manganese, nickel, iron, silver, copper, molybdenum, tin, and various alloys, including alloys of these metals. Examples of semiconductor materials include, but are not limited to, doped and undoped silicon, germanium, gallium arsenide, etc. Any of the above conductors, semiconductors, and dielectrics may have a distinct morphology such as polycrystalline, amorphous, single crystal, and/or microcrystalline. Other materials that may be etched include, but not limited to, CoFeB, $Ge_2Sb_2Te_2$, InSbTe compounds, Ag—Ge—S compounds, and Cu—Te—S compounds. The concept can be extended to materials like NiOx, SrTiOx, perovskite ($CaTiO_3$), $PrCaMnO_3$, PZT ($PbZr_{1-x}Ti_xO_3$), $(SrBiTa)O_3$, and the like.

The apparatus and plasma conditions disclosed herein may be employed to etch features in devices or other structures at any technology node. In some embodiments, the etch is used during fabrication of in the 20-10 nm nodes or beyond. Etching can be used in front end of line fabrication procedures and/or back end of line fabrication procedures.

The etch process may be primarily physical (e.g., non-reactive ion bombardment), primarily chemical (e.g., chemical radicals with only small directional bombardment), or any combination thereof. When a chemical etch is included, the chemical reactant may be any one or more of a variety of etchants including, for example, reactants containing fluorocarbons, fluorine, oxygen, chlorine, etc. Example etchants include chlorine ($Cl_2$), boron trichloride ($BCl_3$), sulfur hexafluoride ($SF_6$), nitrogen trifluoride ($NF_3$), dichlorodifluoromethane ($CCl_2F_2$), phosphorus trifluoride ($PF_3$), trifluoromethane ($CHF_3$), carbonyl fluoride ($COF_2$), oxygen ($O_2$), carbon tetrachloride ($CCl_4$), silicon tetrachloride ($SiCl_4$), carbon monoxde (CO), nitric oxide (NO), methanol ($CH_3OH$), ethanol ($C_2H_5OH$), acetylacetone ($C_5H_8O_2$), hexafluoroacetylacetone ($C_5H_2F_6O_2$), thionyl chloride ($SOCl_2$), thionyl fluoride ($SOF_2$), acetic acid ($CH_3COOH$), pyridine ($C_5H_5N$), formic acid (HCOOH), and combinations thereof. In various embodiments, a combination of these etching reactants is used.

Many types of apparatus are suitable for conducting etch processes that are modeled and/or controlled in accordance with one or more methods and/or apparatus described herein. Examples of such apparatus include inductively coupled plasma reactors and capacitively coupled plasma reactors as described below. In some embodiments, the etch process is coupled with a deposition process (sometimes in a single reactor). Examples of such coupled deposition and etch processes include processes that employ a sidewall protective layer to produce high aspect ratio features (see e.g., U.S. patent application Ser. No. 14/560,414, filed Dec. 4, 2014, U.S. patent application Ser. No. 14/724,574, filed May 28, 2015, and U.S. patent application Ser. No. 14/697,521, filed Apr. 27, 2015 (each of which is incorporated herein by reference in its entirety)). Examples of atomic layer etching processes are described in U.S. Pat. Nos. 8,883,028 and 8,808,561, and U.S. patent application Ser.

No. 14/696,254, filed Apr. 24, 2015, each of which is incorporated herein by reference in its entirety.

The features being etched using a process modeled and/or or monitored as disclosed herein may be characterized by any of various geometric parameters.

Etch depth—This represents the distance between the bottom of an etched feature and a substrate top surface plane such as a field region. The parameter "h" shown in FIG. 1 represents the etch depth of a feature 101 etched in a layer 103 on a substrate 105. Examples of etched features having a depth include holes such as cylinders and trenches. In some implementations, the etch depth is compared in real time to an endpoint depth for an etch process being monitored. As examples, the features being etched have, at the conclusion of the etch process, a depth of between about 10 nm and 1 μm.

Critical dimension—This represents the width of an unetched portion between sidewalls of adjacent etched features. The parameter "CD" shown in FIG. 1 represents examples of critical dimensions of a line 107. Typically, the critical dimension is function of the depth below the substrate top surface plane. As examples, the features being etched may have, at the conclusion of the etch process, a critical dimension of between about 10 nm to 100 μm.

Line width—This represents the width of a raised feature between two or more etch regions. Typically, the line width is defined by the corresponding mask feature width, and unlike the critical dimension, it does not vary with depth. The parameter "w" shown in FIG. 1 represents the line width of line 107.

Pitch—This represents the distance between center points of adjacent parallel lines. In FIG. 1, the parameter "pitch" represents the etch profile's pitch.

Space critical dimension—This represents the difference between the pitch and the line width. It can be viewed as the width of the etch opening.

Aspect ratio—This represents the ratio of etch depth to the space critical dimension. It may be viewed as a measure of the thinness of an etched feature. As an example, a cylinder having a depth of 2 μm and a space critical dimension of 50 nm has an aspect ratio of 40:1, often stated more simply as 40. Shallow features have relatively small aspect ratios, and deep features have relatively large aspect ratios. The features formed through etch processes relating to the disclosed embodiments may be high aspect ratio features. In some applications, a high aspect ratio feature is one having an aspect ratio of at least about 5, at least about 10, at least about 20, at least about 30, at least about 40, at least about 50, at least about 60, at least about 80, or at least about 100. The space critical dimension of the features formed through the disclosed methods may be about 200 nm or less, for example about 100 nm or less, about 50 nm or less, or about 20 nm or less.

FIG. 1 illustrates the evolution of a feature during an etch process. In the top panel, the etch process has just begun, and the etch depth "h" into layer 103 is small. The line width "w" is defined by a lithography mask and, ideally, does not change during the etch process. In the second panel from the top, the etch process has proceeded further to define a more pronounced feature 101 in layer 103. In the lower panel, the etch process has completed and feature 101 reaches the top of an underlying substrate 105. Of course, the completed etch need not reach an underlying substrate, nor need it stop at such substrate.

Various types of optical signals may be measured to obtain information about the etched features. Such signals may be measured before, during, and/or after the etch process.

In certain embodiments, reflectance is measured. Reflectance is a measure of the intensity of radiation reflected from the substrate. The reflected signal may be captured at any angle, from normal to grazing with respect to the substrate surface, regardless of the angle of incidence. The reflected signal may be measured over a range of wavelengths or at discrete wavelengths. Depending on the tool used to measure reflected signal, the available spectral range may be between deep ultraviolet to far infrared. As an example, the available spectral range may be between about 100 nm to about 10,000 nm. The reflected signal may be obtained at various times over the course of an etch process. As examples, the reflected signal may be obtained at time steps of duration between about 0.01 s and 10 s, and the number of such time steps in an etch process may be between about 2 and 1000. In other words, in some examples, about 2 to 1000 measurements are conducted over the course of an etch process.

In general, the optical signals may be obtained from any radiation scattered from a substrate surface. Scattered radiation refers generically to photons or beams which hit a physical object and then keep propagating in some direction. The scattered radiation may be reflected and/or refracted. Sometimes, the incident radiation is diffracted, which occurs when the radiation incident on a substrate surface scatters at multiple angles. Examples include rough surface scatter, in which the scattered radiation is diffuse (going off in multiple directions—i.e., spread out relative to the incident beam) and scatter from periodic surfaces, in which case the scattered radiation is separated into discrete scattered orders, each of which goes in a distinct direction. In some applications, the radiation is scattered in diffracted orders whose reflectance can be measured to determine endpoint. Of course, the disclosed methods and apparatus also apply to scattering from isolated structures that are not periodic.

Examples of metrology tools that may be used to measure optical signals used with the invention include spectral reflectometers, ellipsometers, and scatterometers. Vendors of such tools include KLA-Tencor of San Jose, Calif. and Nanometrics of Milpitas, Calif. Scatterometry refers to tools such as reflectometers and ellipsometers that are intended to measure properties of structures that are often periodic and that reflect in the discrete diffracted orders.

Characteristics of a Model Used to Monitor Etch Geometry Progression

Independent variables are inputs to a model. Some or all of them are measured optical signal from light that interacts with a substrate undergoing etch or that has been etched. The interacting light may be reflected, refracted, scattered diffusely, diffracted, etc. and may be obtained by a metrology tool such as an in situ metrology tool. The independent variable(s) may be a property of the interacting light such as reflected light intensity at one or more angles, etc. The measured optical signal(s) may be measured as a function of time, wavelength (frequency), polarization, or any combination of these. The measured optical signal(s) may be used in raw form or it may be modified (e.g., filtered, normalized, vectorized, etc.) prior to being provided to the model. An independent variable may represent an input and/or cause, and/or is tested to see if it is the cause. An independent variable may also be known as a "predictor variable," "regressor," "controlled variable," "manipulated variable," "explanatory variable," or "input variable."

Dependent variables are output by the model. They may be calculated values of one or more etch geometry parameters such as etch depth, pitch, and critical dimension. These geometric parameters may be provided as a function of time, progressing over the course of an etch process. In some cases, an evolving geometric parameter such as etch depth is repeatedly calculated using optical signals (independent variables) and compared against an endpoint value, and when the value of the geometric parameter matches the endpoint value, the etch process is automatically changed (e.g., concluded) and/or a notification is generated. The value of a dependent variable output by the model, and particularly the value applied to, or used in a process endpoint algorithm which initiates the process control change, may be referred to as a "call" of the endpoint or other process state based on the dependent variable. Dependent variables are sometimes referred to as response variables.

The model relates dependent variable(s) to the independent variable(s). It does so using any one or many different forms. Examples include linear combinations (e.g., a summation of weighted contributions of the independent variables), non-linear expressions (e.g., second or higher order polynomial expressions including the independent variables), look up tables, classification trees, dynamic time warping, similarity metric driven algorithms, pattern matching and classification, variations of multivariate statistics (PCA, PLS), and a host of novelty detection algorithms used in fault detection and classification schemes. In some examples, the model is a neural network.

The model may have one or more of the features described in the following.

In some implementations, the model is computationally efficient so that it can process in situ optical signals in real time to generate a geometric etch parameter from the in situ optical information (e.g., real time end point monitoring). In certain embodiments, the feature characterization algorithm (e.g., endpoint assessment) completes processing in about 100 ms or less (from the time it receives input variable values such as optical measurements). In certain embodiments, the feature characterization algorithm completes processing in about 20 ms or less. Such rapid processing may be employed, for example, in applications with critical step change requirements or in high etch rate processes (e.g., etch processes that complete in less than about a minute). In processes with many variations induced by the processing regime (such as in RF pulsing or gas pulsing) or when the wafer structure itself has a complicated structure (such as in stacks of alternating materials), data arrays (e.g., thousands of them) may be required, sometimes for each of multiple time samples (e.g., one hundred or more, or one thousand or more). The model's execution time also depends on the type of algorithm used. In some implementations the model processes all or much of the time evolution of the spectral information from the beginning of the etch process to the current time. This may require large number of models being created such as with multiway principal component analysis (PCA) and multiway partial least squares (PLS), where each model compares the optical measurement trajectories from the beginning of the etch until the current time step with respect to historical trajectories of corresponding time intervals. Such models have increased computational requirements both during model calibration and during real-time process monitoring as the etch time gets longer. In such cases, the system may be configured with additional processing capabilities such as processors with large amounts of buffer space, multithreading, and/or multiple cores.

In some implementations, a model call (output of a geometric parameter such as an etch depth corresponding to an etch endpoint) is provided with a "confidence." The call may be given a low confidence if the model predicts a geometry outside the range of geometries used to generate or validate the model. For example, if the model determines that a feature being etched has a critical dimension that is narrower than that of any geometries used to generate the model, a called etch depth end point may be given a low confidence. Additionally, a call may be given a low confidence if the optical signals used as inputs are outside an expected range. In certain types of etch process, the signal variations from non-modeled factors influence the fit of the model and can reduce confidence. Examples of such signal variations include "noise" from illumination variations (lamp noise or laser noise), variations in hardware setup relative to those assumed in the model, etc. In probabilistic models, the confidence in a call may include a contribution from data used to develop such models (e.g., the amount of such data and variations in it).

In certain embodiments, the model uses an optical output signal over only a limited range of wavelengths (or other aspect of the optical signal), which may be selected for determining the geometric parameter of interest. The signal in this range is used as an independent variable (or a group of independent variables) for the model. In some such implementations, much of the available optical signal is not used as an input. The selected range may represent a small fraction (e.g., less than about 10% or even a discrete value) of the full range of values that can be measured by the metrology tool. Using a selected range as a model input can require less computation, and therefore faster calculation, to determine an etch feature's geometry. It can also allow selected dependent variables to be calculated without interference from correlated geometric parameters; for example, etch depth can be calculated without significant interference from input signals that strongly correlate with critical dimension. For example, a first wavelength range may strongly correlate with etch depth, while a different wavelength range may strongly correlate with critical dimension but only weakly correlate with etch depth. A process focusing on etch depth may, to avoid obscuring signal, use only optical signals in the first wavelength range.

Depending upon the optical tool used, the usable output signal may be constrained to a narrow range of a characteristic other than wavelength. For example, the used output signal may be limited to a specific polarization state, or to a specific direction with respect to the substrate and/or the incident light. This direction is sometimes the specular direction (reflecting off the surface at the same angle in which it was incident, sometimes called zero-th order reflectance), but in the case of a diffracting periodic surface, the direction may be that of a discrete order reflected at other than the specular direction; these are sometimes referred to as higher diffracted orders. Any one or more directions associated with diffraction orders, including the zeroth-order reflected radiation, may be used.

In some examples, the selected wavelength range or other selected optical parameter range varies as a function of time during the etch process. In other words, the selected range or ranges of optical parameters varies from one time increment to another. This may provide an appropriate way to attack a problem when the spectral structure of the optical signal of interest varies from one time step to the next. For example, the center of a reflected intensity peak associated etch depth may change in wavelength over the period of an etch process.

Figure 2:
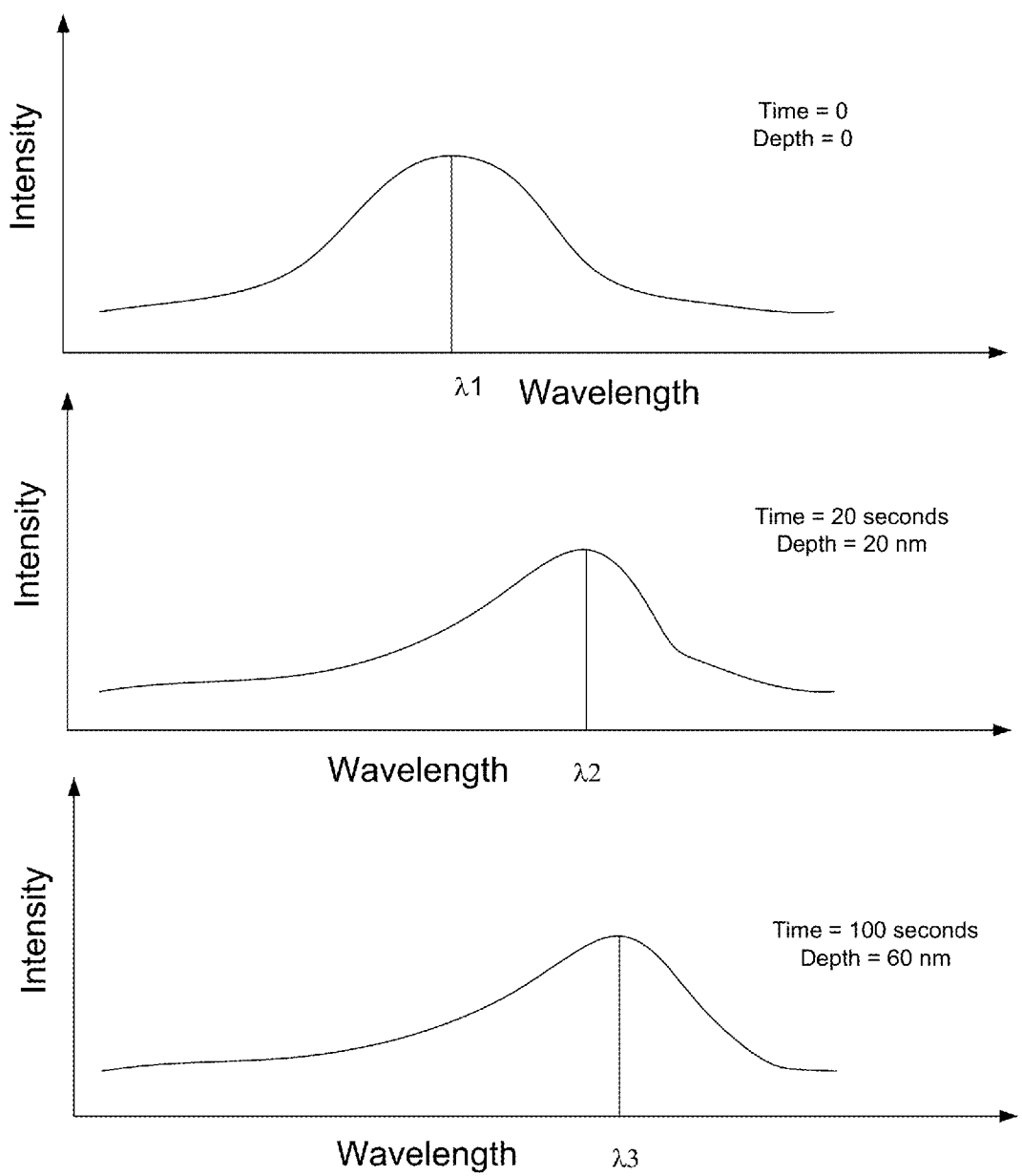
FIG. 2 presents an example of how an optical parameter (e.g., reflected signal intensity at particular direction) can vary with a feature of interest (in this case etch depth) and consequently vary with etch time.

FIG. 2 presents an example of how an optical parameter (e.g., reflected signal intensity at particular direction) can vary with a feature of interest (in this case etch depth) and consequently vary with etch time. The panels of FIG. 2 show three reflectance intensity versus wavelength spectra, each associated with a different etch depth and hence associated with a different time. The top panel of FIG. 2 shows a spectrum at the beginning of an etch process, e.g., when a patterned mask is present but no etching has occurred. At this stage, the reflected intensity has a maximum at lambda1. The middle and lower panels show how the spectrum evolves over the course of the etch process. Notably the intensity peak shifts to longer wavelengths, lambda2 and lambda3 in this example.

In certain embodiments, the selected wavelength range or other selected characteristic of the optical signal is chosen to increase (e.g., maximize) the "targeted sensitivity" where changes in the geometric parameter of interest (e.g., etch depth) cause significant changes in the measured optical parameter (e.g., reflectance intensity), but changes in one or more other geometric parameters (e.g., critical dimension) do not cause a significant change in the measured optical parameter. This may be understood by the example of a time varying measured optical signal that is a function of two or more correlated geometric parameters. A differential equation representing this situation may present the derivative of the optical signal with respect to time as a function of the sum of terms, each including a derivative of the optical signal with respect to one of the geometric parameters.

$$dR/dt = (dR/dDepth)(dDepth/dt) + (dR/dCD)(dCD/dt).$$

In some implementations, the selected wavelengths or other optical parameters are chosen to have a large value of dR/dDepth and a small value of dR/dCD. This allows the model to calculate etch depth without significant contribution by (and interference from) signals that vary with changes in critical dimension. Of course, the selected optical parameter range can be chosen to emphasize any selected feature parameter (e.g., pitch, etch angle, critical dimension, etc.). Further, the selected range of wavelengths (that well represent variations in the feature of interest) may change over time.

In some implementations, multiple optical properties are measured simultaneously, thereby allowing resolution of multiple geometric etch parameters simultaneously. For example, both the intensity and polarization (s- and p-polarization components) of the reflected signal may be measured and provided to a model that employs them as separate independent variables and calculates both time varying etch depth and critical dimension. Other optical properties that can be measured were identified elsewhere herein. One example is the direction of the reflected radiation.

While most examples presented herein consider etch depth as the geometric parameter of interest and critical dimension as a potentially obscuring geometric parameter, some applications may use geometric parameters differently. For example, critical dimension, pitch, sidewall angle, etc. may be the geometric parameter of interest. The present disclosure should be read with this understanding.

Figure 3:
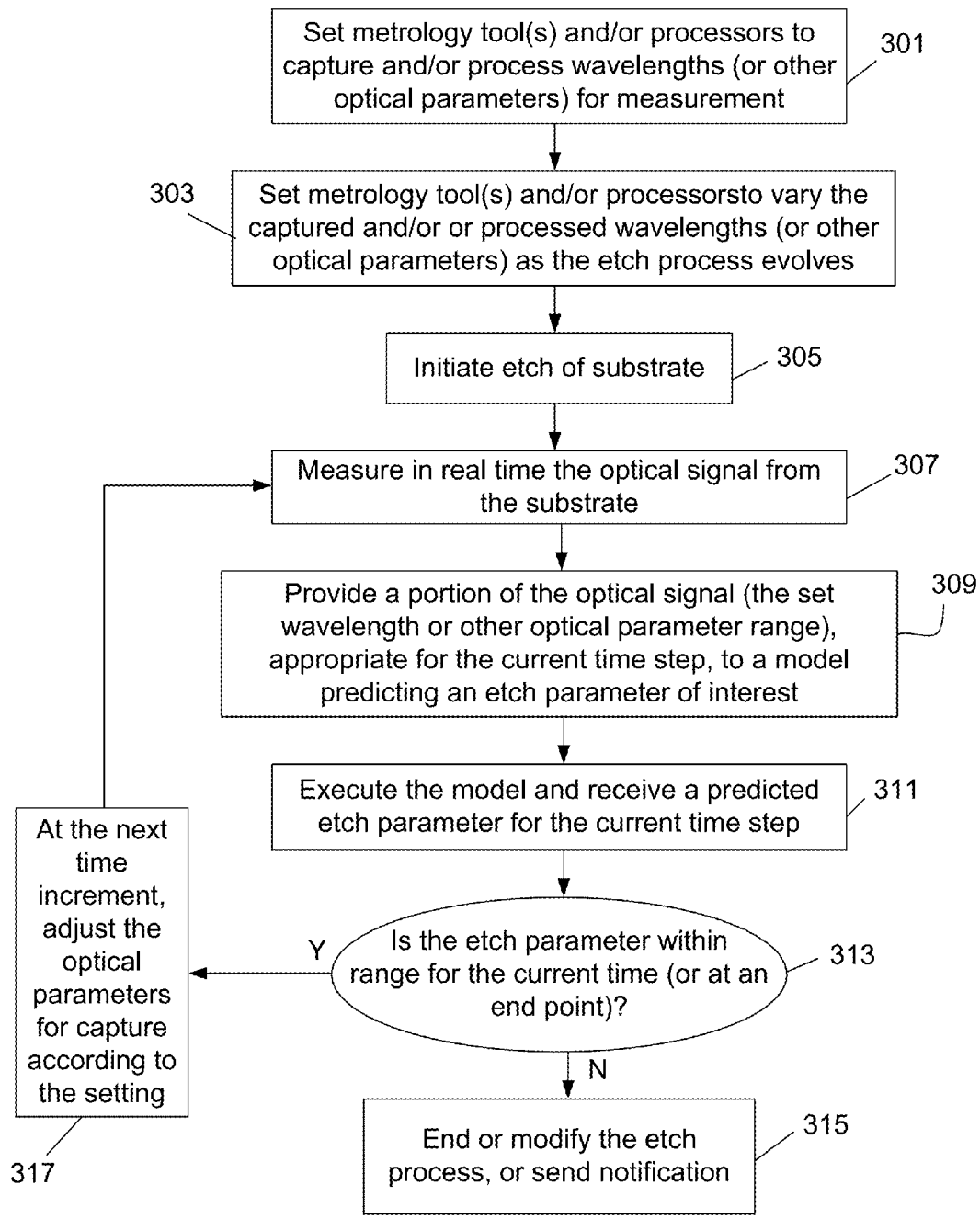
FIG. 3 presents a process for monitoring an etch process and making adjustments if necessary.

FIG. 3 presents a process for monitoring an etch process and making adjustments if necessary. The depicted process has four phases: and initial set up phase as illustrated in blocks 301 and 303, an etch process initiation phase as illustrated in block 305, an etch monitoring and adjustment phase as illustrated by the loop represented in blocks 307, 309, 311, 313, and 317, and finally an etch conclusion phase as illustrated by block 315.

Initially, during the setup phase, the metrology tool and/or processors acting on metrology data are set to provide metrology data appropriate for a monitoring model to monitor an etch process. Thus, in the illustrated example, a process operation 301 sets the metrology tool and/or processors to capture or process only wavelengths or other optical parameters within a range appropriate for the monitoring. As explained above, an etch monitoring algorithm may rely on particular wavelengths or other optical parameters, which are a subset of all available optical parameters, for measurement and processing. For example, a narrow range of wavelengths in the visible or ultraviolet portions of the spectrum may be suitable for real-time monitoring a substrate's etch depth, critical dimension, or other geometric parameter.

In addition to an initial set of wavelengths or other optical parameters for capture, the monitoring algorithm may need to employ variations in such optical parameters over the course of the etch process. To this end, the illustrated process includes an operation 303 which sets the metrology tool and/or processors to vary the captured and/or processed wavelengths or other optical parameters as the etch process evolves. As an example, the initial range of wavelengths as set in operation 301 may straddle the visible and ultraviolet portion of the electromagnetic spectrum, but over time as the etch progresses, the range of wavelengths shifts to entirely within the visible range. Such shift may be pre-set in operation 303.

It should be understood that either or both of set up operations 301 and 303 are optional, and some etch monitoring processes do not require them. As an example, such processes may capture only a narrow band of wavelengths, which are appropriate for the entire etch process. In other examples, the monitoring model may be designed or configured to operate on a wide range of wavelengths (or other optical parameter) in real time and with high precision for the geometric parameter of interest.

Set up operations such as those of operations 301 and 303 may be implemented in various ways. For example, optical settings on a metrology tool and/or data collection settings in processing systems are adjusted or bounded for purposes of the set up and/or control operations.

After the initial setup phase is complete, the process initiates the etch process in an etch chamber as indicated by process operation 305. As understood by those of skill in the art, this may involve positioning a substrate in an etch chamber, evacuating the etch chamber, flowing process gas into the etch chamber, striking a plasma, and the like. Initially, in the etch process, the substrate may include only a mask or other structure for defining an etch pattern. The underlying material to be etched has not been etched in any substantial way before the etch process is initiated in operation 305.

As the etch process unfolds, it is monitored in real time using an optical signal from the substrate as collected by one or more metrology tools and processed according to the settings to find in operations 301 and 303. See process block 307, which represent the continuing measurement of real-time optical signal from the substrate. While monitoring the etch process, the etch/metrology system provides a portion of the optical signal (the set of wavelengths or other optical parameter in the current range), appropriate for the current time step, and the model uses these signals for predicting the etch geometry parameter of interest. See process block 309. As explained, the model may be optimized to process only a particular range of optical parameters (independent variables) at any given time step during the etch process.

Operation 309 ensures that the model receives the collected parameters, as appropriate, for the current time step.

Next, for the current time step, the model executes using the currently input optical parameters and provides a predicted etch geometry parameter. This is illustrated at block 311. While the model is calculating geometric parameters in real time, the monitoring algorithm checks those parameters to determine whether they are within an expected range (for the current time step) or whether they signal an endpoint of the etch process. This check is illustrated at decision block 313. Assuming that the etch geometry parameter(s) predicted by the model continues to fall within the expected range, the monitoring process continues to determine whether the current time increment requires adjusting optical parameters for capture according to pre-existing settings (e.g., settings defined at blocks 301 and/or 303). See process block 317. Whether or not the current optical parameters for capture and processing are adjusted, process control loops back to block 307, where the metrology system continues to collect real-time optical signals. As described above, while this occurs, the processor and associate algorithm continue to (i) provide the appropriate optical signal for the current time step to the model (process block 309) and (ii) execute the model to provide the predicted geometry etch parameter for the current time step (process block 311). Additionally, the processors and algorithm continue to determine whether the predicted etch geometry parameter is within the expected range at process block 313.

At some point, the evaluation conducted in decision operation 313 results in a negative finding, i.e., the etch parameter is outside the expected range for the current time or the etch parameter has reached an endpoint. At that time, process flow is directed to a process operation 315, which modifies or ends the current etch process, or sends a notification to an etch system which can effect automatic or manual intervention in the etch process. Such intervention may involve further evaluation to determine whether a course adjustment is required and/or whether the process should be terminated.

Generating a Model that Calculates Time-Dependent Etch Geometry from Measured Optical Parameters The model may be generated using a training set containing many data points, each having (i) one or more etch geometry values, and (ii) one or more associated optical signal values that are predicted to be (or are) generated from a metrology tool probing a substrate having the etch geometries. The one or more etch geometry feature values can impact the optical readings from the metrology tool. Examples include etch depth, critical dimension, and other features discussed above. Examples of the optical readings include reflectance spectra as a function of time.

The training set data points (geometric etch parameters and associated optical signal values) may be generated experimentally or computationally. In some embodiments, the etch parameters are generated computationally using an etch profile model such as a Surface Kinetic Model (SKM). Such models are described below and in U.S. patent application Ser. No. 14/972,969, filed Dec. 17, 2015, which is incorporated herein by reference in its entirety. When using an SKM or other etch profile model to generate the etch geometry parameter values, the optical parameters generated from the geometry may be modeled or predicted using an optical modeling routine such as the Rigorous Coupled Wave Analysis (RCWA) method or similar technique.

RCWA is but one method that can be used to describe the characteristics of reflected (diffracted, scattered) radiation from a periodic structure such as a grating, or transmitted radiation through such a grating. RCWA was largely developed by Moharam and Gaylord and described in the scientific literature. See e.g., M. G. Moharam and T. K. Gaylord "Rigorous coupled-wave analysis of planar-grating diffraction" J. Opt Soc of America, Vol. 71, Issue 7, pp. 811-818 (1981). RCWA calculates the intensity and polarization characteristics of the various diffracted orders (zeroth order and higher orders). Other optical modelling methods that can provide results include, but are not limited to, C method, Modal method, Rayleigh approximation, EFIE (e-field integration equation), and Cf-FFT (conjugate gradient—fast fourier transform).

Rigorous coupled-wave analysis (RCWA) is a semi-analytical method in computational electromagnetics that is often employed to solve scattering from periodic dielectric structures. It is a Fourier-space method so devices and fields are represented as a sum of spatial harmonics. The method is based on Floquet's theorem that the solutions of periodic differential equations can be expanded with Floquet functions (or sometimes referred as Block wave, especially in solid-state physics). A device is divided into layers that are each uniform in the z direction. A staircase approximation is needed for curved devices with properties such as dielectric permittivity graded along the z-direction. The electromagnetic modes in each layer are calculated and analytically propagated through the layers. The overall problem is solved by matching boundary conditions at each of the interfaces between the layers using a technique like scattering matrices. To solve for the electromagnetic modes, which are decided by the wave vector of the incident plane wave, in periodic dielectric medium, Maxwell's equations (in partial differential form) as well as the boundary conditions are expanded by the Floquet functions and turned into infinitely large algebraic equations. With the cutting off of higher order Floquet functions, depending on the accuracy and convergence speed one needs, the infinitely large algebraic equations become finite and thus solvable by computers.

From the training set, a regression model, neural network, or other appropriate model for relating optical signal to etch geometry can be generated. In one example, partial least squares is used to produce a regression model from the training set data. The resulting model provides a linear combination of multiple wavelength trajectories over time to calculate etch geometry features of interest. As an example, form of the model may be represented as:

$$\text{Etch depth} = \sum_{t=0}^{t=T} \sum_{i}^{\substack{selected \\ lamdas \\ at\ times \\ slice\ t}} b_t(a_i\ lamda_i)_t$$

Where lamba$_i$ is the reflectance or other optical parameter at a selected wavelength and b$_t$ and a$_i$, are coefficients that vary with time and wavelength, respectively.

In various embodiments, a model is generated using a selection process for identifying limited ranges of wavelength or other characteristics of the optical signal to identify data that is a strong function of the geometric parameter of interest and a weak function of one or more other, potentially obscuring, geometric parameters. For example, the process will identify wavelengths of reflectance data that are sensitive to changes in etch depth but relatively insensitive to changes in critical dimension.

Selecting ranges of optical signal values may be accomplished by various techniques such as principal component analysis (PCA) or partial least squares (PLS). PCA may be used as a data compression method which can be used to exclude wavelengths that do not contain significant variation in the data set collected from a set of wafers or from a set of SKM model simulations. PLS can be used in combination with PCA where the principal components obtained from the PCA model can be used as the X-block data for the PLS model and correlation of with the Y-block data (geometric variables) can be studied to select appropriate set of wavelengths. Alternatively, PLS can be used by itself to correlate raw reflectance data as the X-block and geometric variables in the Y-block.

In an alternative approach, inspecting results of a surface kinetic model or other accurate etch profile model over a wide range of optical parameters is used to narrow down the selection of optical parameter range(s). For example, an etch profile model such as a surface kinetic model is used to identify expected etch geometry values for a given etch process, and these etch geometries are used as starting points to manually and/or computationally vary, and from their variation to identify optical parameter ranges that produce a relatively large change in optical signal due to changes in the target geometric parameter of interest and/or relatively small changes in optical signal due to changes in one or more the non-target geometric parameters. Thus, one can vary different geometric parameters and identify a range or ranges of wavelengths or other optical parameters that strongly vary as a function of changes in one geometric parameter but not others. This can be performed by calculating sensitivity matrices of dR/dGeometricParameter for all parameters over large range of wavelengths and down select a subset based on desired targeted sensitivity (e.g., wavelengths sensitive to depth but not sensitive to CD changes).

Figure 4:
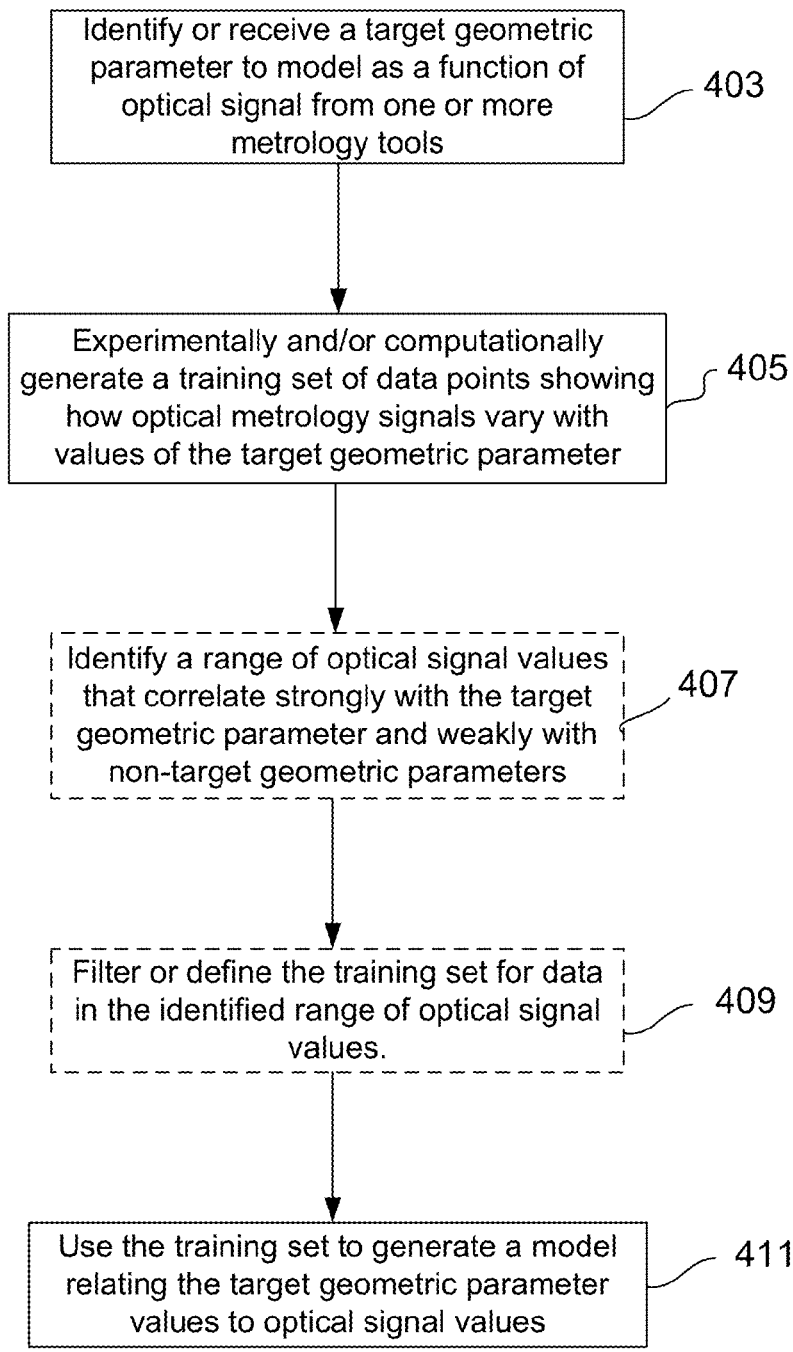
FIG. 4 presents a flow chart of a method for generating models in accordance with certain embodiments.

FIG. 4 presents a flow chart of a method for generating models in accordance with certain embodiments. As shown in the depicted flow, the process begins at a block 403 where the model generating system receives a target geometric parameter that is to be modeled as a function of the optical signals produced using one or more optical metrology tools. The geometric parameter may be any of those identified above, e.g. the depth of an etched feature in a substrate. The choice of such parameter is, of course, governed by the needs of the organization controlling the etching process and associated semiconductor device fabrication process.

A model is generated from a training set of data points, each providing a combination of the target geometric parameter value (e.g., an etch depth) and one or more optical signal values produced in response to the geometric parameter value. In other words, each member of a training set includes a geometry value associated with a feature and associated optical signals produced from the particular feature. In some implementations, a training set member may include multiple parameter values for a given feature (e.g., etch depth and critical dimension).

To generate the model, the training set must be prepared experimentally or computationally as indicated at process block 405. In certain embodiments, the process employs a training set of at least about 50 members, or at least about 100 members, or at least about 200 members, or at least about 500 members. The training set members are used collectively to develop a relationship between the target geometric parameter and optical signals generated from such geometric parameter.

Alternatively, a single run (experimental or computational) that produces a set of profiles over multiple time steps can be used as the center-point of simulated design of experiments (DOE) to build a model. In this approach, a series of modifications are applied to the profiles by changing the geometric variables in a DOE fashion trying to capture the effects of individual geometric variables and their cross terms on the optical reflectance. Each modified profile is passed through optical model (e.g., RCWA) calculation to obtain the corresponding optical reflectance. The resulting set of optical reflectances and the geometric variables can be used in PCA and/or PLS to down select a range of wavelengths best correlates with the desired geometric variable.

In certain embodiments, before using the training set to generate the model, the method identifies a subset of the optical signal values that correlate strongly with the target geometric parameter and weakly with non-target geometric parameters. See optional step 407 depicted in the process flow. As explained above, narrowing the range of optical signals for consideration may have various benefits such as providing more reliable determination of the target geometric parameter and/or doing so faster by, e.g., consuming relatively little computational resource.

Assuming that the range of optical signal values is narrowed as illustrated in block 407, the process then optionally filters the training set to remove data outside the identified range of optical signal values. See block 409. In another approach, the model generation process simply generates additional data points for the training set, where such additional data points have optical signal values in the range identified in operation 407.

Regardless of whether the optional steps 407 and 409 are performed, the process ultimately uses the training set to generate a model relating the target geometric parameter values to optical signal values as indicated in a process block for 411. Various techniques for generating the model may be employed, such as those described above, including neural networks and regression techniques including partial least squares.

Etch Profile Models Including Surface Kinetic Models

As mentioned above, an etch profile model, which relates etch geometry values to physical and/or chemical etch conditions, may be used for various purposes including generating data to produce a model used in an in situ metrology system for an etcher. In the context of an etch profile model, an etch profile refers to any set of values for a set of one or more geometric coordinates which may be used to characterize the shape of an etched feature on a semiconductor substrate. In a simple case, an etch profile can be approximated as the width of a feature determined halfway to the base of the feature (the midpoint between the feature's base (or bottom) and it's top opening on the surface of the substrate) as viewed through a 2-dimensional vertical cross-sectional slice through the feature. In a more complicated example, an etch profile may be series of feature widths determined at various elevations above the base of the feature as viewed through the same 2-dimensional vertical cross-sectional slice.

As noted above, such a width may be referred to as a "critical dimension" and the elevation from the base of the feature may be referred to as the height or the z-coordinate of the so-referred-to critical dimension. The etch profile may be represented in other geometric references such as by a group of vectors from a common origin or a stack of shapes such as trapezoids or triangles or a group of characteristic shape parameters that define a typical etch profile such as bow, straight or tapered sidewall, rounded bottom, facet etc.

In this way, a series of geometric coordinates (e.g., feature widths at different elevations) maps out a discretized portrayal of a feature's profile. Note, that there are many ways to express a series of coordinates which represent feature width at different elevations. For instance, each coordinate might have a value which represents a fractional deviation from some baseline feature width (such as an average feature width, or a vertically averaged feature width), or each coordinate might represent the change from the vertically adjacent coordinate, etc. In any event, what is being referred to as "width" or "critical dimension" and, generally, the scheme being used for the set of profile coordinates used to represent an etch profile will be clear from the context and usage. The idea is that a set of coordinates are used represent the shape of the feature's etched profile. It is also noted that a series of geometric coordinates could also be used to describe the full 3-dimensional shape of a feature's etched profile or other geometric characteristic, such as the shape of an etched cylinder or trench on a substrate surface. Thus, in some embodiments, a etch profile model may provide a full 3-D etch shape of the feature being modeled.

Etch profile models compute an etch profile from a set of input etch reaction parameters (independent variables) characterizing the underlying physical and chemical etch processes and reaction mechanisms. These processes are modelled as a function of time and location in a grid representing features being etched and their surroundings. Examples of input parameters include plasma parameters such as ion flux and chemical reaction parameters such as the probability that a particular chemical reaction will occur. These parameters (and particularly, in some embodiments, the plasma parameters) may be obtained from various sources, including other models that calculate them from general reactor configurations and process conditions such as pressure, substrate temperature, plasma source parameters (e.g., power, frequencies, duty cycles provided to the plasma source), reactants, and their flow rates. In some embodiments, such model is part of the etch profile model.

As explained, etch profile models take reaction parameters as independent variables and generate etch profiles as response variables. In other words, a set of independent variables are the physical/chemical process parameters used as inputs to the model, and response variables are the etch profile features calculated by the model. The etch profile models employ one or more relationships between the reaction parameters and the etch profile. The relationships may include, e.g., coefficients, weightings, and/or other model parameters (as well as linear functions of, second and higher order polynomial functions of, etc. the reaction parameters and/or other model parameters) that are applied to the independent variables in a defined manner to generate the response variables, which are related to the etch profiles. Such weightings, coefficients, etc. may represent one or more of the reaction parameters described above.

Some etch profile models employ independent variables that may be characterized as fundamental reaction mechanistic parameters and may be viewed as fundamental to the underlying chemistry and physics and therefore the experimental process engineer generally does not have control over these quantities. In the etch profile model, these variables are applied at each location of a grid and at multiple times, separated by defined time steps. In some implementations, the grid resolution may vary between about a few Angstroms and about a micrometer. In some implementations, the time steps may vary between about 1e-15 and 1e-10 seconds. In certain embodiments, the model employs two types of mechanistic independent variables: (1) local plasma parameters and (2) local chemical reaction parameters. These parameters are "local" in the sense that they may vary as a function of position, in some cases down to the resolution of the grid. Examples of the plasma parameters include local plasma properties such as fluxes and energies of particles such ions, radicals, photons, electrons, excited species, depositor species and their energy and angular distributions etc. Examples of chemical and physico-chemical reaction parameters include rate constants (e.g., probabilities that a particular chemical reaction will occur at a particular time), sticking coefficients, energy threshold for etch, reference energy, exponent of energy to define sputter yields, angular yield functions and its parameters, etc. Further, the parameterized chemical reactions include reactions in which the reactants include the material being etched and an etchant. It should be understood that the chemical reaction parameters may include various types of reactions in addition to the reactions that directly etch the substrate. Examples of such reactions include side reactions, including parasitic reactions, deposition reactions, reactions of by-products, etc. Any of these might affect the overall etch rate. It should also be understood that the model may require other input parameters, in addition to the above-mentioned plasma and chemical reaction input parameters. Examples of such other parameters include the temperature at the reaction sites, the partial pressure of reactants, etc. In some cases, these and/or other non-mechanistic parameters may be input in a module that outputs some of the mechanistic parameters.

In some embodiments, values for the independent variables are obtained from various sources such as the literature, calculations by other computational modules or models, etc. In some embodiments, the independent variables—such as the plasma parameters—may be determined by using a model such as, for the case of the plasma parameters, from an etch chamber plasma model. Such models may calculate the applicable input etch profile model parameters from various process parameters over which the process engineer does have control (e.g., by turning a knob)—e.g., chamber environment parameters such as pressure, flow rate, plasma power, wafer temperature, ICP coil currents, bias voltages/power, pulsing frequency, pulse duty cycle, and the like.

When running an etch profile model, some of the independent variables may be set to known or expected parameter values used to perform the experiments. For example, the plasma parameters may be fixed to known or expected values at locations in modeled domain. Other independent variables are those which are tuned. For example, the chemical reaction parameters may be the tuned. Thus, in a series of runs corresponding to a given measured experimental etch profile, the model parameters are varied in order to elucidate how to choose values of these parameters to best optimize the model. In other embodiments, the plasma and chemical reaction parameters are known ahead of time.

Etch profile models may take any of many different forms. Ultimately, they provide a relationship between the independent and dependent (or response) variables. The relationship may be linear or nonlinear. Generally, an etch profile model is what is referred to in the art as a cell-based Monte Carlo surface reaction model. These models, in their various forms, operate to simulate a wafer feature's topographical evolution over time in the context of semiconductor wafer fabrication. The models launch pseudo-particles with energy and angular distributions produced by a plasma model or experimental diagnostics for arbitrary radial locations on the wafer. The pseudo-particles are statistically weighted to represent the fluxes of radicals and ions to the surface. The models address various surface reaction mechanisms resulting in etching, sputtering, mixing, and deposition on the surface to predict profile evolution. During a Monte Carlo integration, the trajectories of various ion and neutral pseudo-particles are tracked within a wafer feature until they either react or leave the computational domain. The etch profile model may be able to predict features of etching, stripping, atomic layer etching, ionized metal physical vapor deposition, and plasma enhanced chemical vapor deposition on various materials. In some embodiments, an etch profile model utilizes a rectilinear mesh in two or three dimensions, the mesh having a fine enough resolution to adequately address/model the dimensions of the wafer feature (although, in principle, the mesh (whether 2D or 3D) could utilize non-rectilinear coordinates as well). The mesh may be viewed as an array of grid-points in two or three dimensions. It may also be viewed as an array of cells which represent the local area in 2D, or volume in 3D, associated with (centered at) each grid-point. Each cell within the mesh may represent a different solid material or a mixture of materials. Whether a 2D or 3D mesh is chosen as a basis for the modeling may depend on the class/type of wafer feature being modelled. For instance, a 2D mesh may be used to model a long trench feature (e.g., in a polysilicon substrate), the 2D mesh delineating the trench's cross-sectional shape under the assumption that the geometry of the ends of the trench are not too relevant to the reactive processes taking place down the majority of the trench's length away from its ends (i.e., for purposes of this cross-sectional 2D model, the trench is assumed infinite, again a reasonable assumption for a trench feature away from its ends). On the other hand, it may be appropriate to model a circular via feature (a through-silicon via (TSV)) using a 3D mesh (since the x,y horizontal dimensions of the feature are on par with each other).

Mesh spacing may range from sub-nanometer (e.g., from 1 Angstrom) up to several micrometers (e.g., 10 micrometers). Generally, each mesh cell is assigned a material identity, for example, photoresists, polysilicon, plasma (e.g., in the spatial region not occupied by the feature), which may change during the profile evolution. Solid phase species are represented by the identity of the computational cell; gas phase species are represented by computational pseudo-particles. In this manner, the mesh provides a reasonably detailed representation (e.g., for computational purposes) of the wafer feature and surrounding gas environment (e.g., plasma) as the geometry/topology of the wafer feature evolves over time in a reactive etch process.

To train and optimize the etch profile models presented in the previous section, various experiments may be performed in order to determine—as accurately as the experiments allow—the actual etch profiles which result from actual etch processes performed under the various process conditions as specified by various sets of etch process parameters. Thus, for instance, one specifies a first set of values for a set of etch process parameters—such as etchant flow rate, plasma power, temperature, pressure, etc.—sets up the etch chamber apparatus accordingly, flows etchant into the chamber, strikes the plasma, etc., and proceeds with the etching of the first semiconductor substrate to generate a first etch profile. One then specifies a second set of values for the same set of etch process parameters, etches a second substrate to generate a second etch profile, and so forth.

Various combinations of process parameters may be used to present a broad or focused process space, as appropriate, to train the etch profile model. The same combinations of process parameters are then used to calculate (independent) input parameters, such as the mechanistic parameters, to the etch profile model to provide etch profile outputs (response variables) that can be compared against the experimental results. Because experimentation can be costly and time consuming, techniques can be employed to design experiments in a way that reduces the number of experiments that need be conducted to provide a robust training set for optimizing the etch profile model. Techniques such as design of experiments (DOE) may be employed for this purpose. Generally, such techniques determine which sets of process parameters to use in various experiments. They choose the combinations of process parameters by considering statistical interactions between process parameters, randomization, and the like. As an example, DOE may identify a small number of experiments covering a limited range of parameters around the center point of a process that has been finalized.

Typically, a researcher will conduct all experiments early in the model optimization process and use only those experiments in the optimization routine iterations until convergence. Alternatively, an experiment designer may conduct some experiments for early iterations of the optimization and additional experiments later as the optimization proceeds. The optimization process may inform the experiment designer of particular parameters to be evaluated and hence particular experiments to be run for later iterations.

One or more in-situ or offline metrology tools may be used to measure the experimental etch profiles which result from these experimental etch process operations. Measurements made be made at the end of the etch processes, during the etch processes, or at one or more times during the etch processes. When measurements are made at the end of an etch process, the measurement methodology may be destructive, when made at intervals during the etch process, the measurement methodology would generally be non-destructive (so not to disrupt the etch). Examples of appropriate metrology techniques include, but not limited to, LSR, OCD, and cross-sectional SEM. Note that a metrology tool may directly measure a feature's profile, such as is the case of SEM (wherein the experiment basically images a feature's etch profile), or it may indirectly determine a feature's etch profile, such as in the case of OCD measurements (where some post-processing is done to back-out the feature's etch profile from the actual measured data).

In any event, the result of the etch experiments and metrology procedures is a set of measured etch profiles, each generally including a series of values for a series of coordinates or a set of grid values which represent the shape of the feature's profile as described above. The etch profiles may then be used as inputs to train, optimize, and improve the computerized etch profile models as described below.

Applications of Computerized Etch Profile Models

In certain embodiments, an etch profile model may be integrated with an etcher apparatus or into the infrastructure of a semiconductor fabrication facility which deploys one or more etcher apparatuses. The etch profile model may be used to determine appropriate adjustments to process parameters to provide a desired etch profile or to understand the effect of a change in process parameters on the etch profile. Thus, for instance, a system for processing semiconductor substrates within a fabrication facility may include an etcher apparatus for etching semiconductor substrates whose operation is adjusted by a set of independent input parameters which are controlled by a controller which implements an etch profile model. As describe below, a suitable controller for controlling the operation of the etcher apparatus typically includes a processor and a memory, the memory storing the etch profile model, and the processor using the stored etch profile model to compute etched feature profiles for a given set of values of a set of input process parameters. After computing a profile, in some embodiments, the controller may (in response to the shape of the computed profile) adjust the operation of the etcher apparatus by varying one or more values of the set of independent input parameters.

Generally, an etcher apparatus which may be used with the disclosed etch profile models may be any sort of semiconductor processing apparatus suitable for etching semiconductor substrates by removing material from their surface. In some embodiments, the etcher apparatus may constitute an inductively-coupled plasma (ICP) reactor; in some embodiments, it may constitute a capacitively-coupled plasma (CCP) reactor. Thus, an etcher apparatus for use with these disclosed etch profile models may have a processing chamber, a substrate holder for holding a substrate within the processing chamber, and a plasma generator for generating a plasma within the processing chamber. The apparatus may further include one or more valve-controlled process gas inlets for flowing one or more process gases into the processing chamber, one or more gas outlets fluidically connected to one or more vacuum pumps for evacuating gases from the processing chamber, etc. Further details concerning etcher apparatuses (also generally referred to as etch reactors, or plasma etch reactors, etc.) are provided below.

Capacitively Coupled Plasma (CCP) Reactors for Use in Etch Operations

Capacitively coupled plasma (CCP) reactors are described in U.S. Pat. No. 8,552,334, filed Feb. 9, 2009 as U.S. patent application Ser. No. 12/367,754, and titled "ADJUSTABLE GAP CAPACITIVELY COUPLED RF PLASMA REACTOR INCLUDING LATERAL BELLOWS AND NON-CONTACT PARTICLE SEAL," and in U.S. patent application Ser. No. 14/539,121, filed Nov. 12, 2014, and titled "ADJUSTMENT OF VUV EMISSION OF A PLASMA VIA COLLISIONAL RESONANT ENERGY TRANSFER TO AN ENERGY ABSORBER GAS," each of which is hereby incorporated by reference in its entirety for all purposes. In certain embodiments, a capacitively coupled reactor executes substrate etching using an etch geometry model for end point detection or other control or monitoring operation.

Figure 5A:
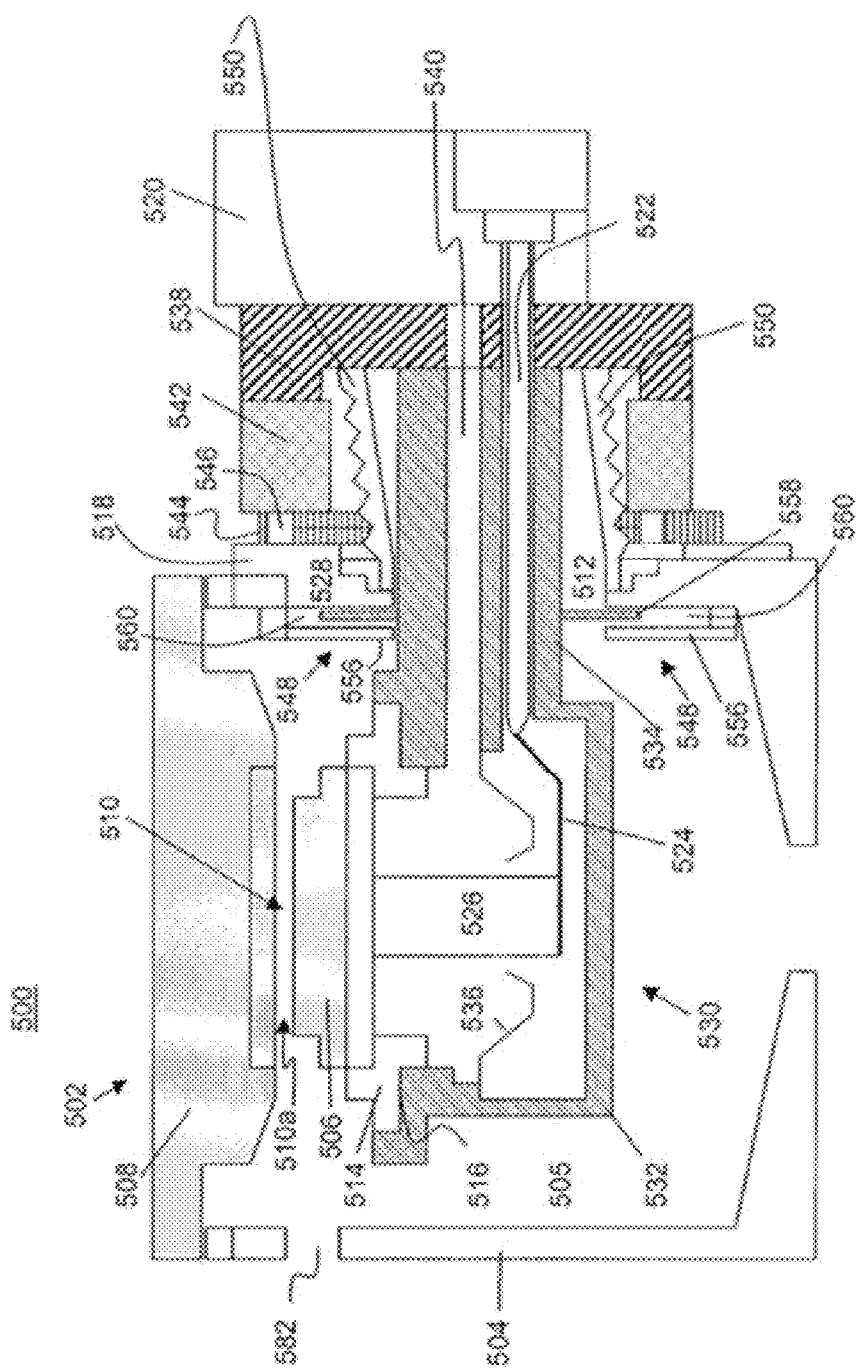
FIGS. 5A-5C illustrate an embodiment of an adjustable gap capacitively coupled confined RF plasma reactor.
Figure 5B:
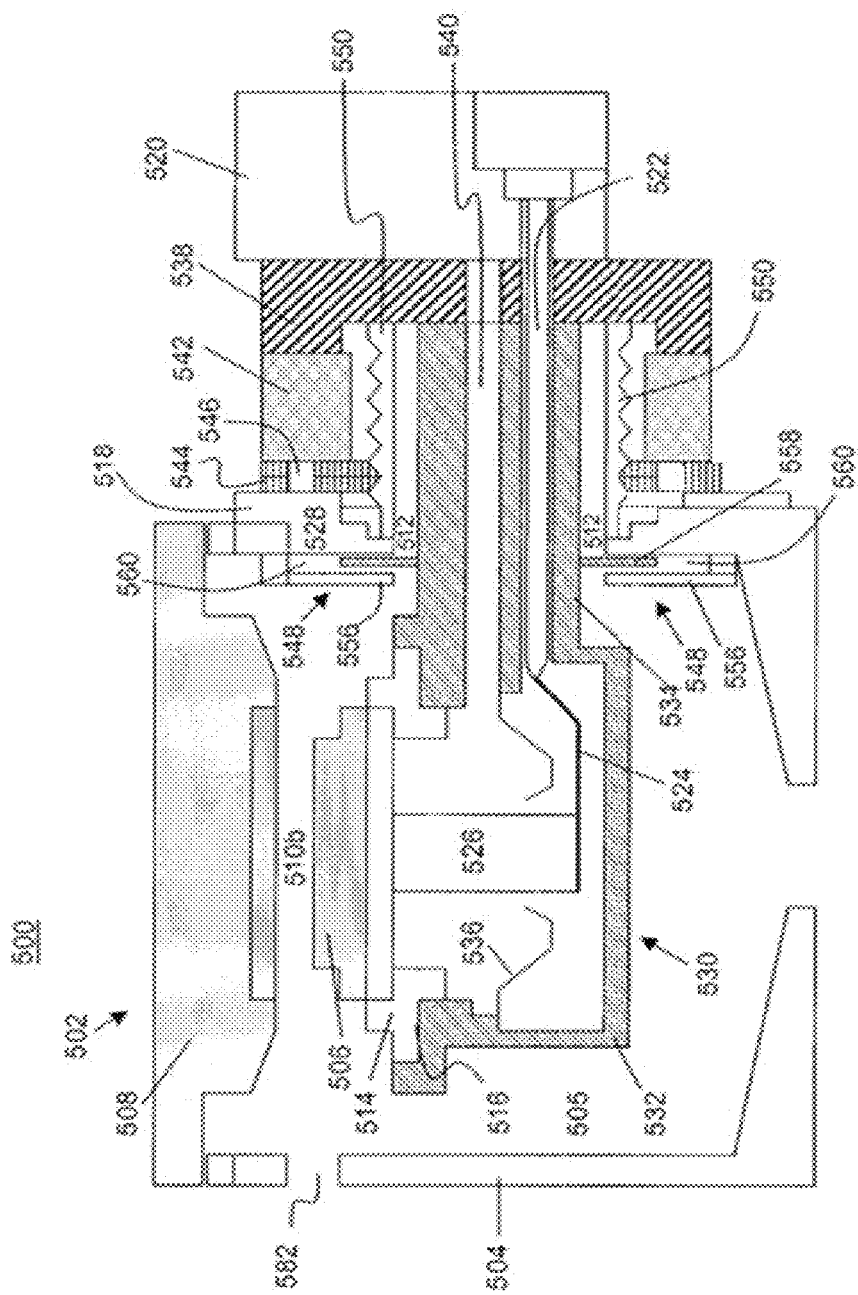
Figure 5C:
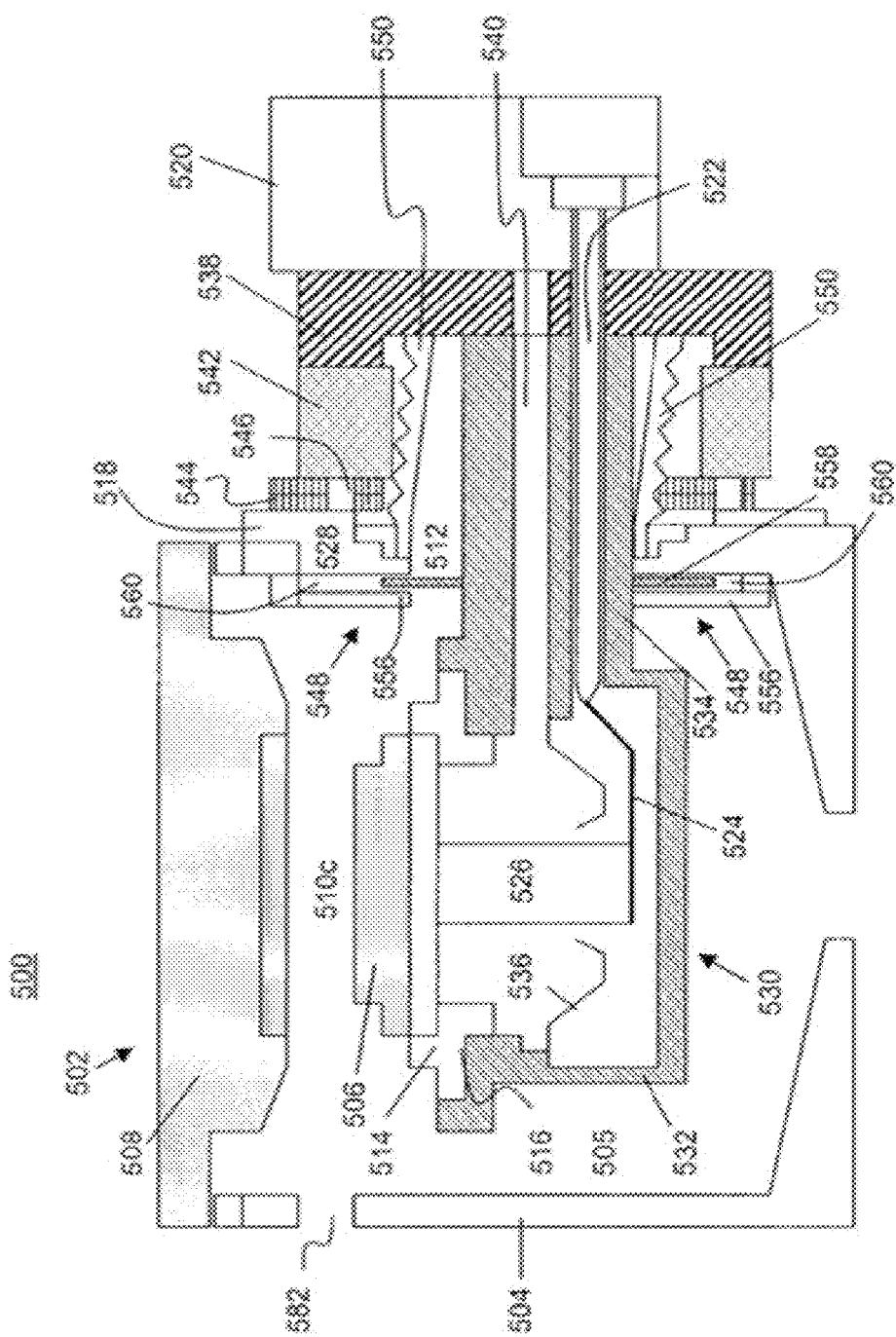

FIGS. 5A-5C illustrate an embodiment of an adjustable gap capacitively coupled confined RF plasma reactor 500. As depicted, a vacuum processing chamber 502 includes a chamber housing 504, surrounding an interior space housing a lower electrode 506. In an upper portion of the chamber 502 an upper electrode 508 is vertically spaced apart from the lower electrode 506. Planar surfaces of the upper and lower electrodes 508, 506 (configured to be used for plasma generation) are substantially parallel and orthogonal to the vertical direction between the electrodes. In certain embodiments, the upper and lower electrodes 508, 506 are circular and coaxial with respect to a vertical axis. A lower surface of the upper electrode 508 faces an upper surface of the lower electrode 506. The spaced apart facing electrode surfaces define an adjustable gap 510 there between. During plasma generation, the lower electrode 506 is supplied RF power by an RF power supply (match) 520. RF power is supplied to the lower electrode 506 though through an RF supply conduit 522, an RF strap 524 and an RF power member 526. A grounding shield 536 may surround the RF power member 526 to provide a more uniform RF field to the lower electrode 506. As described in U.S. Pat. Publication No. 2008/0171444 (which is hereby incorporated by reference in its entirety for all purposes), a wafer is inserted through wafer port 582 and supported in the gap 510 on the lower electrode 506 for processing, a process gas is supplied to the gap 510 and excited into plasma state by the RF power. The upper electrode 508 can be powered or grounded.

In the embodiment shown in FIGS. 5A-5C, the lower electrode 506 is supported on a lower electrode support plate 516. An insulator ring 514 interposed between the lower electrode 506 and the lower electrode support plate 516 insulates the lower electrode 506 from the support plate 516. An RF bias housing 530 supports the lower electrode 506 on an RF bias housing bowl 532. The bowl 532 is connected through an opening in a chamber wall plate 518 to a conduit support plate 538 by an arm 534 of the RF bias housing 530. In a preferred embodiment, the RF bias housing bowl 532 and RF bias housing arm 534 are integrally formed as one component, however, the arm 534 and bowl 532 can also be two separate components bolted or joined together.

The RF bias housing arm 534 includes one or more hollow passages for passing RF power and facilities, such as gas coolant, liquid coolant, RF energy, cables for lift pin control, electrical monitoring and actuating signals from outside the vacuum chamber 502 to inside the vacuum chamber 502 at a space on the backside of the lower electrode 506. The RF supply conduit 522 is insulated from the RF bias housing arm 534, the RF bias housing arm 534 providing a return path for RF power to the RF power supply 520. A facilities conduit 540 provides a passageway for facility components. Further details of the facility components are described in U.S. Pat. No. 5,948,704 and U.S. Pat. Pub. No. 2008/0171444 (both of which are hereby incorporated by reference in their entirety for all purposes) and are not shown here for simplicity of description. The gap 510 is preferably surrounded by a confinement ring assembly (not shown), details of which can be found in U.S. Pat. Pub. No. 2007/0284045 (which is hereby incorporated by reference in its entirety for all purposes).

The conduit support plate 538 is attached to an actuation mechanism 542. Details of an actuation mechanism are described in U.S. Pat. Pub. No. 2008/0171444 (which is hereby incorporated by reference in its entirety for all purposes). The actuation mechanism 542, such as a servo mechanical motor, stepper motor or the like is attached to a vertical linear bearing 544, for example, by a screw gear 546 such as a ball screw and motor for rotating the ball screw. During operation to adjust the size of the gap 510, the actuation mechanism 542 travels along the vertical linear bearing 544. FIG. 5A illustrates the arrangement when the actuation mechanism 542 is at a high position on the linear bearing 544 resulting in a small gap 510a. FIG. 5B illustrates the arrangement when the actuation mechanism 542 is at a mid-position on the linear bearing 544. As shown, the lower electrode 506, the RF bias housing 530, the conduit support plate 538, the RF power supply 520 have all moved lower with respect to the chamber housing 504 and the upper electrode 508, resulting in a medium size gap 510b.

FIG. 5C illustrates a large gap 510c when the actuation mechanism 542 is at a low position on the linear bearing. Preferably, the upper and lower electrodes 508, 506 remain coaxial during the gap adjustment and the facing surfaces of the upper and lower electrodes across the gap remain parallel.

This embodiment allows the gap 510 between the lower and upper electrodes 506, 508 in the CCP chamber 502 during multi-step etch processes to be adjusted, for example, in order to maintain uniform etch across a large diameter substrate such as 300 mm wafers or flat panel displays. In particular, this embodiment pertains to a mechanical arrangement to facilitate the linear motion necessary to provide the adjustable gap between lower and upper electrodes 506, 508.

FIG. 5A illustrates laterally deflected bellows 550 sealed at a proximate end to the conduit support plate 538 and at a distal end to a stepped flange 528 of chamber wall plate 518. The inner diameter of the stepped flange defines an opening 512 in the chamber wall plate 518 through which the RF bias housing arm 534 passes. The laterally deflected bellows 550 provides a vacuum seal while allowing vertical movement of the RF bias housing 530, conduit support plate 538 and actuation mechanism 542. The RF bias housing 530, conduit support plate 538 and actuation mechanism 542 can be referred to as a cantilever assembly. Preferably, the RF power supply 520 moves with the cantilever assembly and can be attached to the conduit support plate 538. FIG. 5B shows the bellows 550 in a neutral position when the cantilever assembly is at a mid-position. FIG. 5C shows the bellows 550 laterally deflected when the cantilever assembly is at a low position.

A labyrinth seal 548 provides a particle barrier between the bellows 550 and the interior of the plasma processing chamber housing 504. A fixed shield 556 is immovably attached to the inside inner wall of the chamber housing 504 at the chamber wall plate 518 so as to provide a labyrinth groove 560 (slot) in which a movable shield plate 558 moves vertically to accommodate vertical movement of the cantilever assembly. The outer portion of the movable shield plate 558 remains in the slot at all vertical positions of the lower electrode 506.

In the embodiment shown, the labyrinth seal 548 includes a fixed shield 556 attached to an inner surface of the chamber wall plate 518 at a periphery of the opening 512 in the chamber wall plate 518 defining a labyrinth groove 560. The movable shield plate 558 is attached and extends radially from the RF bias housing arm 534 where the arm 534 passes through the opening 512 in the chamber wall plate 518. The movable shield plate 558 extends into the labyrinth groove 560 while spaced apart from the fixed shield 556 by a first gap and spaced apart from the interior surface of the chamber wall plate 518 by a second gap allowing the cantilevered assembly to move vertically. The labyrinth seal 548 blocks migration of particles spalled from the bellows 550 from entering the vacuum chamber interior and blocks radicals from process gas plasma from migrating to the bellows 550 where the radicals can form deposits which are subsequently spalled.

FIG. 5A shows the movable shield plate 558 at a higher position in the labyrinth groove 560 above the RF bias housing arm 534 when the cantilevered assembly is in a high position (small gap 510a). FIG. 5C shows the movable shield plate 558 at a lower position in the labyrinth groove 560 above the RF bias housing arm 534 when the cantilevered assembly is in a low position (large gap 510c). FIG. 5B shows the movable shield plate 558 in a neutral or mid position within the labyrinth groove 560 when the cantilevered assembly is in a mid position (medium gap 510b). While the labyrinth seal 548 is shown as symmetrical about the RF bias housing arm 534, in other embodiments the labyrinth seal 548 may be asymmetrical about the RF bias arm 534.

Inductively Coupled Plasma Reactors for Use in Etch Operations

Inductively coupled plasma (ICP) reactors are described in US Pat. Pub. No. 2014/0170853, filed Dec. 10, 2013, and titled "IMAGE REVERSAL WITH AHM GAP FILL FOR MULTIPLE PATTERNING," and in U.S. patent application Ser. No. 14/539,121, filed Nov. 12, 2014, and titled "ADJUSTMENT OF VUV EMISSION OF A PLASMA VIA COLLISIONAL RESONANT ENERGY TRANSFER TO AN ENERGY ABSORBER GAS," each of which is hereby incorporated by reference in its entirety for all purposes.

Figure 6:
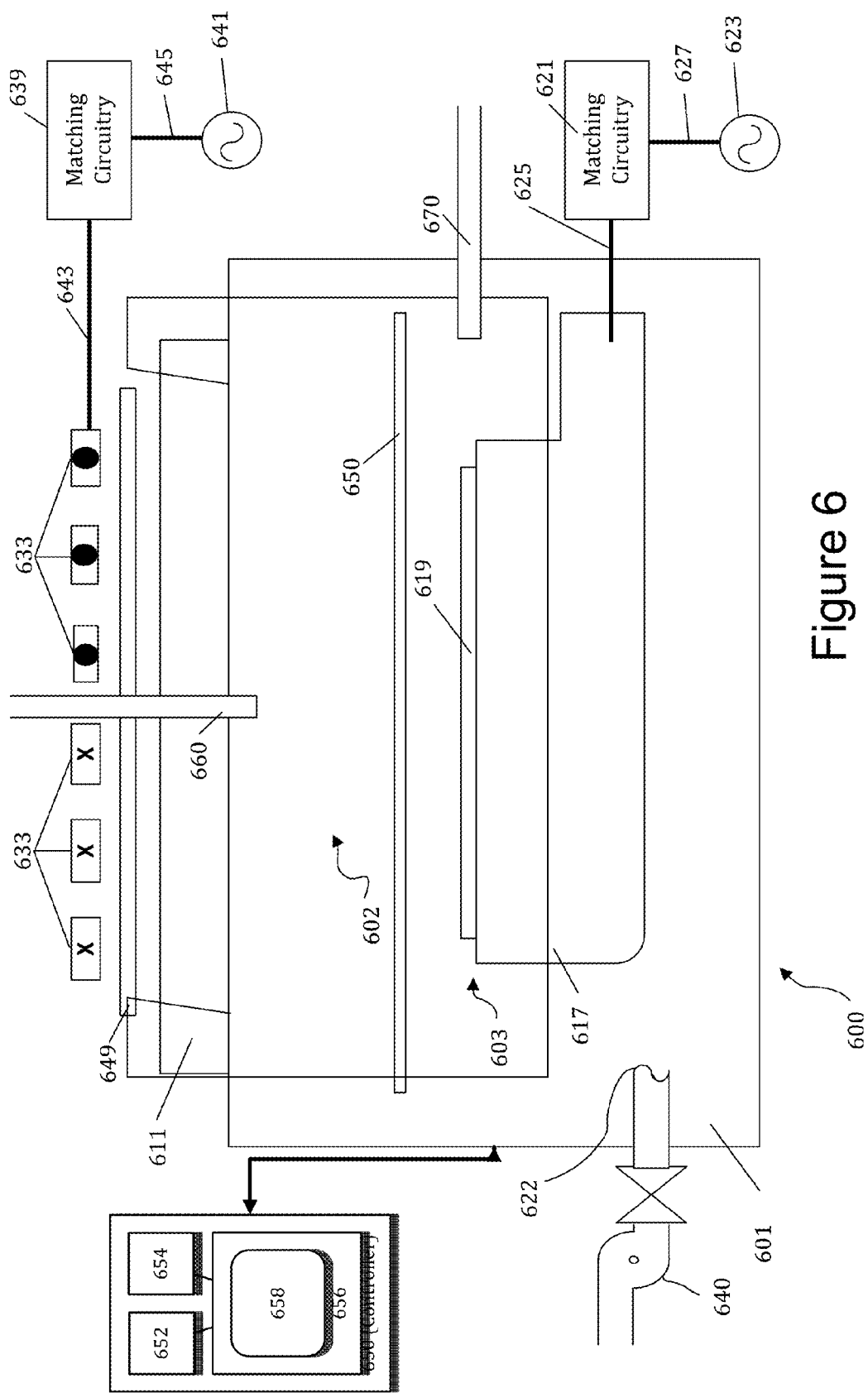
FIG. 6 illustrates a cross-sectional view of an inductively coupled plasma etching apparatus appropriate for implementing certain embodiments herein, an example of which is a Kiyo™ reactor, produced by Lam Research Corp. of Fremont, Calif.

For instance, FIG. 6 schematically shows a cross-sectional view of an inductively coupled plasma etching apparatus 600 appropriate for implementing certain embodiments herein, an example of which is a Kiyo™ reactor, produced by Lam Research Corp. of Fremont, Calif. The inductively coupled plasma etching apparatus 600 includes an overall etching chamber structurally defined by chamber walls and a window 611. The chamber walls may be fabricated from stainless steel or aluminum. The window 611 may be fabricated from quartz or other dielectric material. An optional internal plasma grid 651 divides the overall etching chamber into an upper sub-chamber 602 and a lower sub-chamber 603. In most embodiments, plasma grid 651 may be removed, thereby utilizing a chamber space made of sub-chambers 602 and 603. A chuck 617 is positioned within the lower sub-chamber 603 near the bottom inner surface. The chuck 617 is configured to receive and hold a semiconductor wafer 619 upon which the etching process is performed. The chuck 617 can be an electrostatic chuck for supporting the wafer 619 when present. In some embodiments, an edge ring (not shown) surrounds chuck 617, and has an upper surface that is approximately planar with a top surface of a wafer 619, when present over chuck 617. The chuck 617 also includes electrostatic electrodes for chucking and dechucking the wafer. A filter and DC clamp power supply (not shown) may be provided for this purpose. Other control systems for lifting the wafer 619 off the chuck 617 can also be provided. The chuck 617 can be electrically charged using an RF power supply 623. The RF power supply 623 is connected to matching circuitry 621 through a connection 627. The matching circuitry 621 is connected to the chuck 617 through a connection 625. In this manner, the RF power supply 623 is connected to the chuck 617.

Elements for plasma generation include a coil 633 is positioned above window 611. The coil 633 is fabricated from an electrically conductive material and includes at least one complete turn. The example of a coil 633 shown in FIG. 6 includes three turns. The cross-sections of coil 633 are shown with symbols, and coils having an "X" extend rotationally into the page, while coils having a "•" extend rotationally out of the page. Elements for plasma generation also include an RF power supply 641 configured to supply RF power to the coil 633. In general, the RF power supply 641 is connected to matching circuitry 639 through a connection 645. The matching circuitry 639 is connected to the coil 633 through a connection 643. In this manner, the RF power supply 641 is connected to the coil 633. An optional Faraday shield 649 is positioned between the coil 633 and the window 611. The Faraday shield 649 is maintained in a spaced apart relationship relative to the coil 633. The Faraday shield 649 is disposed immediately above the window 611. The coil 633, the Faraday shield 649, and the window 611 are each configured to be substantially parallel to one another. The Faraday shield 649 may prevent metal or other species from depositing on the dielectric window of the plasma chamber.

Process gases (e.g. helium, neon, etchant, etc.) may be flowed into the processing chamber through one or more main gas flow inlets 660 positioned in the upper chamber and/or through one or more side gas flow inlets 670. Likewise, though not explicitly shown, similar gas flow inlets may be used to supply process gases to the capacitively coupled plasma processing chamber shown in FIGS. 5A-5C. A vacuum pump, e.g., a one or two stage mechanical dry pump and/or turbomolecular pump 640, may be used to draw process gases out of the process chamber 624 and to maintain a pressure within the process chamber 601. A valve-controlled conduit may be used to fluidically connect the vacuum pump to the processing chamber so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber in FIGS. 5A-5C may also be employed.

During operation of the apparatus, one or more process gases may be supplied through the gas flow inlets 660 and/or 670. In certain embodiments, process gas may be supplied only through the main gas flow inlet 660, or only through the side gas flow inlet 670. In some cases, the gas flow inlets shown in the figure may be replaced more complex gas flow inlets, one or more showerheads, for example. The Faraday shield 649 and/or optional grid 651 may include internal channels and holes that allow delivery of process gases to the chamber. Either or both of Faraday shield 649 and optional grid 651 may serve as a showerhead for delivery of process gases.

Radio frequency power is supplied from the RF power supply 641 to the coil 633 to cause an RF current to flow through the coil 633. The RF current flowing through the coil 633 generates an electromagnetic field about the coil 633. The electromagnetic field generates an inductive current within the upper sub-chamber 602. The physical and chemical interactions of various generated ions and radicals with the wafer 619 selectively etch features of the wafer.

If the plasma grid is used such that there is both an upper sub-chamber 602 and a lower sub-chamber 603, the inductive current acts on the gas present in the upper sub-chamber 602 to generate an electron-ion plasma in the upper sub-chamber 602. The optional internal plasma grid 651 limits the amount of hot electrons in the lower sub-chamber 603. In some embodiments, the apparatus is designed and operated such that the plasma present in the lower sub-chamber 603 is an ion-ion plasma.

Both the upper electron-ion plasma and the lower ion-ion plasma may contain positive and negative ions, though the ion-ion plasma will have a greater ratio of negative ions to positive ions. Volatile etching byproducts may be removed from the lower-subchamber 603 through port 622.

The chuck 617 disclosed herein may operate at elevated temperatures ranging between about 10° C. and about 250° C. The temperature will depend on the etching process operation and specific recipe. In some embodiments, the chamber 601 may also operate at pressures in the range of between about 1 mTorr and about 95 mTorr. In certain embodiments, the pressure may be higher as disclosed above.

Chamber 601 may be coupled to facilities (not shown) when installed in a clean room or a fabrication facility. Facilities include plumbing that provide processing gases, vacuum, temperature control, and environmental particle control. These facilities are coupled to chamber 601, when installed in the target fabrication facility. Additionally, chamber 601 may be coupled to a transfer chamber that allows robotics to transfer semiconductor wafers into and out of chamber 601 using typical automation.

Also shown in FIG. 6 is system controller 650. As described further below, such a system controller 650 may control some or all of the operations of an etcher apparatus, not limited to chamber 601, including adjustment of the etcher's operation in response to the generation of a computed etch geometry (e.g., feature depth or critical dimension) using a model as described herein.

System Controllers

A system controller may be used to control etching operations (or other processing operations) in any of the above described processing apparatuses, such as the CCP etcher apparatuses shown in FIGS. 5A-5C, and/or the ICP etcher apparatus shown in FIG. 6. In particular, the system controller may implement a etch geometry model as described above and adjust operation of an etcher apparatus in response to computed etch profiles generated using the etch geometry model (as described above).

An example of a system controller in communication with an etcher apparatus is schematically illustrated in FIG. 6. As shown in FIG. 6, system controller 650 includes one or more memory devices 656, one or more mass storage devices 654, and one or more processors 652. Processor 652 may include one or more CPUs, ASICs, general-purpose computer(s) and/or specific purpose computer(s), one or more analog and/or digital input/output connection(s), one or more stepper motor controller board(s), etc.

In some embodiments, a system controller (e.g., 650 in FIG. 6) controls some or all of the operations of a process tool (e.g., etcher apparatus 600 in FIG. 6) including the operations of its individual process stations. Machine-readable system control instructions 658 may be provided for implementing/performing the film deposition and/or etch processes described herein. The instructions may be provided on machine-readable, non-transitory media which may be coupled to and/or read by the system controller. The instructions may be executed on processor 652—the system control instructions, in some embodiments, loaded into memory device 656 from mass storage device 654. System control instructions may include instructions for controlling the timing, mixture of gaseous and liquid reactants, chamber and/or station pressures, chamber and/or station temperatures, wafer temperatures, target power levels, RF power levels (e.g., DC power levels, RF bias power levels), RF exposure times, substrate pedestal, chuck, and/or susceptor positions, and other parameters of a particular process performed by a process tool.

Semiconductor substrate processing operations may employ various types of processes including, but not limited to, processes related to the etching of film on substrates (including atomic layer etch (ALE) operations involving plasma-activation of surface adsorbed etchants, see, e.g., U.S. patent application Ser. No. 14/539,121, filed Nov. 12, 2014, and titled "ADJUSTMENT OF VUV EMISSION OF A PLASMA VIA COLLISIONAL RESONANT ENERGY TRANSFER TO AN ENERGY ABSORBER GAS," which is hereby incorporated by reference in its entirety for all purposes), deposition processes (such as atomic layer deposition (ALD), by plasma-activation of surface adsorbed film precursors), as well as other types of substrate processing operations.

Thus, for example, with respect to a processing apparatus for performing plasma-based etch processes, the machine-readable instructions executed by a system controller may include instructions for generating a computed etch profile from an optimized etch profile model and adjusting operation of the plasma generator in response to the computed etch profile.

System control instructions 658 may be configured in any suitable way. For example, various process tool component subroutines or control objects may be written to control operation of the process tool components necessary to carry out various process tool processes. System control instructions may be coded in any suitable computer readable programming language. In some embodiments, system control instructions are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 658 may include input/output control (IOC) sequencing instructions for controlling the various parameters described above. For example, each phase of a deposition and/or etch process or processes may include one or more instructions for execution by the system controller. The instructions for setting process conditions for a film deposition and/or etch process phase, for example, may be included in a corresponding deposition and/or etch recipe phase. In some embodiments, the recipe phases may be sequentially arranged, so that all instructions for a process phase are executed concurrently with that process phase.

Other computer-readable instructions and/or programs stored on mass storage device 654 and/or memory device 656 associated with system controller 650 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal and to control the spacing between the substrate and other parts of process tool. The positioning program may include instructions for appropriately moving substrates in and out of the reaction chamber as necessary to deposit and/or etch film on the substrates.

A process gas control program may include instructions for controlling gas composition and flow rates and optionally for flowing gas into the volumes surrounding one or more process stations prior to deposition and/or etch in order to stabilize the pressure in these volumes. In some embodiments, the process gas control program may include instructions for introducing certain gases into the volume(s) surrounding the one or more process stations within a processing chamber during film deposition and/or etching operations on substrates. The process gas control program may also include instructions to deliver these gases at the same rates, for the same durations, or at different rates and/or for different durations depending on the composition of the film being deposited and/or the nature of the etching process involved. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates and/or etching of the substrates.

A heater control program may include instructions for controlling the current to a heating unit that is used to heat the substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates and/or etching of the substrates.

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during film deposition on and/or etching of the substrates.

In some embodiments, there may be a user interface associated with the system controller. The user interface may include a display screen, graphical software displays of the apparatus and/or process conditions, and user input devices such as pointing devices, keyboards, touch screens, microphones, etc.

In some embodiments, parameters adjusted by system controller may relate to process conditions. Non-limiting examples include process gas compositions and flow rates, temperatures (e.g., substrate holder and showerhead temperatures), pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of the system controller from various process tool sensors. The signals for controlling the processes may be output on the analog and/or digital output connections of the process tool. Non-limiting examples of process tool sensors that may be monitored include mass flow controllers (MFCs), pressure sensors (such as manometers), temperature sensors such as thermocouples, etc. Appropriately programmed feedback and control algorithms may be used with data from these sensors to maintain process conditions.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

In some implementations, a controller is part of a system, which may be part of the above-described etchers. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module (employing inductively or capacitively coupled plasmas), a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Other Embodiments

Although the foregoing disclosed techniques, operations, processes, methods, systems, apparatuses, tools, films, chemistries, and compositions have been described in detail within the context of specific embodiments for the purpose of promoting clarity and understanding, it will be apparent to one of ordinary skill in the art that there are many alternative ways of implementing the foregoing embodiments which are within the spirit and scope of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

What is claimed is:

1. A method of generating a computational model that relates measured optical signals produced by optical energy interacting with features etched on a substrate to values of a target geometric parameter of the features etched on the substrate, the method comprising:
    determining a range of the measured optical signals for use in the computational model, wherein determining the range comprises:
    identifying a first change in the measured optical signals in the range due to a variation in values of a non-target geometric parameter,
    identifying a second change in the measured optical signals in the range due to a variation in values of the target geometric parameter, and
    determining that the second change is greater than the first change;
    providing a training set having members with values of the optical signals in the range, wherein each member of the training set comprises (i) a value of the target geometric parameter of the features etched in the substrate, and (ii) an associated optical signal produced from etched features having the value of the target geometric parameter of the features etched in the substrate; and
    producing the computational model from the training set.

2. The method of claim 1, wherein the members of the training set further comprise values of a non-target geometric parameter of the features etched in the substrate.

3. The method of claim 1, wherein the members of the training set are obtained experimentally.

4. The method of claim 1, wherein the members of the training set are generated computationally.

5. The method of claim 4, wherein the members of the training set are generated from a surface kinetic model and an optical modelling routine.

6. The method of claim 1, wherein the training set comprises at least about 50 members.

7. The method of claim 1, wherein producing the computational model from the training set comprises using a neural network or a regression technique.

8. The method of claim 1, wherein the target geometric parameter of the features etched on the substrate is an etch depth, a pitch, or an etch critical dimension.

9. The method of claim 1, wherein the measured optical signals comprise reflectance values produced from the features etched on the substrate.

10. The method of claim 1, wherein the range where the measured optical signals correlate less strongly with a non-target geometric parameter than with the target geometric parameter is a range of wavelengths.

11. The method of claim 1, wherein determining the range comprises determining variations in the range according to variations in correlation of the measured optical signals with the target geometric parameter for different values of the target geometric parameter.

12. A computational model configured to calculate values of a target geometric parameter for features etched on a substrate from measured optical signals produced by optical energy interacting with the features etched on the substrate, wherein the computational model was generated by the method of claim 1.

13. A method of determining an etch process endpoint of a target geometric parameter value for one or more features produced on a substrate during an etch process, the method comprising:
(a) directing incident electromagnetic radiation onto the substrate;
(b) measuring optical signals produced by the incident electromagnetic radiation interacting with features being etched on the substrate;
(c) providing a subset of the measured optical signals, wherein the subset is defined by a range where optical signals were determined to correlate with values of a target geometric parameter for the features;
(d) applying the subset of optical signals to a model configured to predict the target geometric parameter values from the measured optical signals, wherein the model was generated by determining the range where optical signals were determined to correlate with target geometric parameter values for features;
(e) determining, from the model, a current value of the target geometric parameter of the features being etched;
(f) comparing the current value of the target geometric parameter of the features being etched to an etch process endpoint value for the target geometric parameter; and
(g) repeating (b)-(f) until the comparing in (f) indicates that the current value of the target geometric parameter of the features being etched has reached the etch process endpoint value.

14. The method of claim 13, wherein the target geometric parameter of the features being etched is an etch depth, a pitch, or an etch critical dimension.

15. The method of claim 13, further comprising terminating the etch process when the comparing in (e) indicates that the current value of the target geometric parameter of the features being etched has reached the etch process endpoint value.

16. The method of claim 13, wherein measuring optical signals produced in (a) comprises measuring reflectance produced from the features being etched on the substrate.

17. The method of claim 13, wherein the range defining the subset of measured optical signals in (b) is a range of wavelengths where the optical signals were determined, using a regression technique, to correlate with the target geometric parameter value for the features.

18. The method of claim 13, wherein the range defining the subset of measured optical signals in (b) varies between two repetitions of (a)-(e).

19. The method of claim 18, wherein the range defining the subset of measured optical signals in (b) was determined to vary according to variations in correlation of the optical signals with the target geometric parameter for different values of the target geometric parameter.

20. The method of claim 13, wherein the range defining the subset of measured optical signals in (b) is a range where the optical signals were determined to correlate less strongly with a non-target geometric parameter than the target geometric parameter.

21. A system for etching one or more features on a substrate during an etch process, the system comprising:
an etching apparatus for etching semiconductor substrates; and
a controller for controlling the operation of the etching apparatus, the controller comprising non-transitory memory storing executable instructions for:
(a) directing incident electromagnetic radiation to the substrate;
(b) measuring optical signals produced by optical energy interacting with features being etched on the substrate;
(c) providing a subset of the measured optical signals, wherein the subset is defined by a range where optical signals were determined to correlate with values of a target geometric parameter for the features;
(d) applying the subset of optical signals to a model configured to predict the target geometric parameter values from the measured optical signals, wherein the model was generated by determining the range where optical signals were determined to correlate with target geometric parameter values for features;
(e) determining, from the model, a current value of the target geometric parameter of the features being etched;
(f) comparing the current value of the target geometric parameter of the features being etched to an etch process endpoint value for the target geometric parameter; and
(g) repeating (b)-(f) until the comparing in (f) indicates that the current value of the target geometric parameter of the features being etched has reached the etch process endpoint value.

22. The system of claim 21, wherein the etching apparatus comprises:
a processing chamber;
a substrate holder for holding a substrate within the processing chamber;
a plasma generator for generating a plasma within the processing chamber, the plasma generator comprising an RF power supply;
one or more valve-controlled process gas inlets for flowing one or more process gases into the processing chamber; and
one or more gas outlets fluidically connected to one or more vacuum pumps for evacuating gases from the processing chamber.

23. The system of claim 21, wherein the controller further comprises instructions for terminating the etch process when the comparing in (e) indicates that the current value of the target geometric parameter of the features being etched has reached the etch process endpoint value.

24. The system of claim 21, wherein the range defining the subset of measured optical signals in (b) is a range of wavelengths where the optical signals were determined, using a regression technique, to correlate with the target geometric parameter value for the features.

25. The system of claim 21, wherein the controller further comprises instructions for varying the range defining the subset of measured optical signals in (b) between two repetitions of executing instructions for (a)-(e).

26. The system of claim 25, wherein the range defining the subset of measured optical signals in (b) was determined to vary according to variations in correlation of the optical signals with the target geometric parameter for different values of the target geometric parameter.

27. The system of claim 21, wherein the range defining the subset of measured optical signals in (b) is a range where the optical signals were determined to correlate less strongly with a non-target geometric parameter than the target geometric parameter.

28. The computational model of claim 12, wherein the members of the training set used to generate the computational model further comprised values of a non-target geometric parameter of the features etched in the substrate.

29. The computational model of claim 12, wherein the members of the training set used to generate the computational model were obtained experimentally.

30. The computational model of claim 12, wherein the members of the training set used to generate the computational model were generated computationally.

31. The computational model of claim 30, wherein the members of the training set were generated from a surface kinetic model and an optical modelling routine.

32. The computational model of claim 12, wherein the training set comprised at least about 50 members.

33. The computational model of claim 12, wherein the computational model was produced from the training set using a neural network or a regression technique.

34. The computational model of claim 12, wherein the target geometric parameter of the features etched on the substrate is an etch depth, a pitch, or an etch critical dimension.

35. The computational model of claim 12, wherein the optical signals comprise reflectance values produced from the features etched on the substrate.

36. The computational model of claim 12, wherein, when generating the computational model, the range where the measured optical signals correlate less strongly with a non-target geometric parameter than with the target geometric parameter is a range of wavelengths.

37. The computational model of claim 12, wherein, when generating the computational model, determining the range comprises determining variations in the range according to variations in correlation of the optical signals with the target geometric parameter for different values of the target geometric parameter.

38. The system of claim 21, wherein the target geometric parameter of the features being etched is an etch depth, a pitch, or an etch critical dimension.

39. The system of claim 21, wherein controller's instructions for measuring optical signals produced in (a) comprise instructions for measuring reflectance produced from the features being etched on the substrate.

* * * * *